United States Patent
Kawanago et al.

(10) Patent No.: US 12,515,282 B2
(45) Date of Patent: Jan. 6, 2026

(54) FLUX AND METHOD FOR PRODUCING ELECTRONIC COMPONENT

(71) Applicant: SENJU METAL INDUSTRY CO., LTD., Tokyo (JP)

(72) Inventors: Tomohisa Kawanago, Tokyo (JP); Yasuhiro Kajikawa, Tokyo (JP); Kuniaki Sato, Tokyo (JP); Ayaka Shirakawa, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 19/099,227

(22) PCT Filed: Aug. 22, 2023

(86) PCT No.: PCT/JP2023/030134
§ 371 (c)(1),
(2) Date: Jan. 28, 2025

(87) PCT Pub. No.: WO2024/043231
PCT Pub. Date: Feb. 29, 2024

(65) Prior Publication Data
US 2025/0256363 A1      Aug. 14, 2025

(30) Foreign Application Priority Data
Aug. 26, 2022   (JP) .................. 2022-135236

(51) Int. Cl.
*B23K 35/362*   (2006.01)
*B23K 35/36*    (2006.01)
(Continued)

(52) U.S. Cl.
CPC ........ *B23K 35/362* (2013.01); *B23K 35/3613* (2013.01); *B23K 35/3618* (2013.01);
(Continued)

(58) Field of Classification Search
CPC .............. B23K 25/362; B23K 25/3613; B23K 25/3618; H01L 21/4853; H01L 21/4871;
(Continued)

(56) References Cited

U.S. PATENT DOCUMENTS 12,220,771  B2 *   2/2025  Yamagame .......... B23K 35/025
2012/0305632 A1   12/2012  Ross et al.
(Continued)

FOREIGN PATENT DOCUMENTS

CN      101695794 A      4/2010
CN      102049631 A      5/2011
(Continued)

OTHER PUBLICATIONS

International Search Report for Application No. PCT/JP2023/030134, mailed Nov. 14, 2023 (4 pages).
(Continued)

*Primary Examiner* — Jasmine J Clark
(74) *Attorney, Agent, or Firm* — Nixon Peabody LLP; Jeffrey L. Costellia

(57) ABSTRACT

Provided is a flux that can suppress the generation of voids when an indium alloy sheet is used to perform a continuous reflow under different temperature conditions. The present invention employs a flux that contains a rosin ester, an organic acid (A), and a solvent (S). The organic acid (A) includes a dimer acid (A1) that demonstrates a weight reduction rate of not more than 1 mass % in a thermogravimetric analysis in which the dimer acid is heated up to 260° C. at a temperature rising rate of 10° C./min. The solvent (S) includes a solvent (S1) that demonstrates the weight reduction rate of at least 99 mass % in a thermogravimetric analysis in which the solvent (S1) is heated up to 150° C. at a temperature rising rate of 6° C./min.

9 Claims, 2 Drawing Sheets

(51) Int. Cl.
*H01L 21/48* (2006.01)
*H01L 23/00* (2006.01)

(52) U.S. Cl.
CPC ...... *H01L 21/4853* (2013.01); *H01L 21/4871* (2013.01); *H01L 24/29* (2013.01); *H01L 24/83* (2013.01); *H01L 24/32* (2013.01); *H01L 2224/29109* (2013.01); *H01L 2224/29139* (2013.01); *H01L 2224/32245* (2013.01); *H01L 2224/83191* (2013.01); *H01L 2224/83815* (2013.01); *H01L 2924/16235* (2013.01)

(58) Field of Classification Search
CPC ............. H01L 24/29; H01L 24/83; H01L 2224/29109; H01L 2224/29139; H01L 2224/32245; H01L 2224/83191; H01L 2224/83815; H01L 2429/16235
USPC ........................................................ 438/121
See application file for complete search history.

(56) References Cited

U.S. PATENT DOCUMENTS

| | | |
|---|---|---|
| 2020/0391329 A1 | 12/2020 | Onitsuka et al. |
| 2021/0060714 A1 | 3/2021 | Kawasaki et al. |
| 2022/0193834 A1 | 6/2022 | Ikeda |

FOREIGN PATENT DOCUMENTS

| | | | |
|---|---|---|---|
| CN | 105855749 | A | 8/2016 |
| CN | 108296673 | A | 7/2018 |
| CN | 109641324 | A | 4/2019 |
| CN | 111526967 | A | 8/2020 |
| CN | 111989188 | A | 11/2020 |
| JP | 2010539706 | A | 12/2010 |
| JP | 2012223622 | A | 11/2012 |
| JP | 2015085353 | A | 5/2015 |
| JP | 6501003 | B | 4/2019 |
| JP | 6540788 | B | 7/2019 |
| JP | 6540789 | A | 7/2019 |
| JP | 2019-130566 | A | 8/2019 |
| JP | 6638841 | B | 1/2020 |
| JP | 6646242 | B | 2/2020 |
| JP | 2020040105 | A | 3/2020 |
| JP | 2020163455 | A | 10/2020 |
| JP | 7427657 | B2 | 2/2024 |
| TW | 202106890 | A | 2/2021 |
| WO | 2009035907 | A2 | 3/2009 |

OTHER PUBLICATIONS

Japanese Notice of Reasons for Rejection for Application No. 2022-135236, mailed Oct. 25, 2022 (6 pages).

Taiwan Search Report for Application No. 112131720, mailed May 28, 2024 (13 pages).

Office Action in Chinese Patent Application No. 2023800607914 with English Translation, dated Jul. 26, 2025, (7 pages).

Notice of Allowance in Korean Patent Application No. 10-2025-7005604 with English Translation, mailed May 28, 2025, (5 pages).

Office Action in European Patent Application 23857340.6, dated Sep. 25, 2025, (5 pages).

* cited by examiner

FLUX AND METHOD FOR PRODUCING ELECTRONIC COMPONENT

TECHNICAL FIELD

The present invention relates to a flux and a method for producing an electronic component. Priority is claimed on Japanese Patent Application No. 2022-135236, filed Aug. 26, 2022, the content of which is incorporated herein by reference.

BACKGROUND ART

In recent years, electronic devices have been required to have a large capacity and a high speed. A highly integrated die installed in such an electronic device generates a large amount of heat during an operation. Therefore, it is necessary to efficiently discharge the generated heat by mounting a lid or the like, which is provided with a heat sink, on the die.

Under such circumstances, for example, Patent Document 1 suggests that a thermal interface material (TIM) containing a polymer is interposed between a die and a lid provided with a heat sink in order to transmit heat generated by the operation of the die to the heat sink with higher efficiency.

CITATION LIST

Patent Document

Patent Document 1: Published Japanese Translation No. 2010-539706 of the PCT International Publication

SUMMARY OF INVENTION

Technical Problem

Meanwhile, a sheet in which the content of indium is increased (hereinafter, referred to as an indium alloy sheet) has been suggested as the TIM. As an alloy which is a raw material of the indium alloy sheet, for example, an alloy having 90% by mass of In and 10% by mass of Ag is used.

Indium has a hardness lower than the hardness of other metal elements, and the indium alloy sheet has high followability and high adhesiveness with respect to the surfaces of a die and a lid. Therefore, the indium alloy sheet has high heat transfer efficiency from the die to the lid provided with a heat sink. As a result, it is possible to increase the efficiency of discharging heat due to the operation of the die by using the indium alloy sheet. In addition, the indium alloy sheet containing Ag has a thermal conductivity higher than the thermal conductivity of an indium sheet consisting of indium, and thus the efficiency of discharging heat can be further improved.

In mounting of the indium alloy sheet, a lid provided with a heat sink and a die are bonded by primary reflow using an indium alloy sheet having a surface coated with a flux, to obtain a semiconductor package. Since indium has a relatively low melting point of 156° C., the bonding by the primary reflow is carried out under a low temperature condition as compared with the typical bonding.

In a case where the primary reflow is carried out, for example, under a condition of 170° C. using a conventional flux for soldering, the flux does not wet-spread on the surface of the indium sheet and is accumulated on the bonding surface, and as a result, a large number of voids are generated on the bonding surface in some cases. Due to the voids, the heat transfer efficiency from a chip to the lid provided with the heat sink via the indium sheet is reduced, and the efficiency of discharging heat due to the operation of the die is reduced.

Next, solder balls are bonded to the rear surface of the semiconductor package by carrying out secondary reflow after the primary reflow. This secondary reflow is carried out, for example, under a high temperature condition of 250° C. in order to melt the solder balls. Since the secondary reflow is carried out at a high temperature, an activator or the like is easily gasified, and thus voids are easily formed.

In a case where two times of reflow including primary reflow and secondary reflow are carried out as described above using a conventional flux for soldering and an indium alloy sheet, there is a problem in that a large amount of voids are likely to be generated on a bonding surface of the indium alloy sheet. Due to the voids, the heat transfer efficiency from the die to the lid provided with the heat sink via the indium alloy sheet is reduced, and the efficiency of discharging heat due to the operation of the die is reduced.

Therefore, an object of the present invention is to provide a flux capable of suppressing generation of voids when reflow is continuously carried out under different temperature conditions using an indium alloy sheet.

Solution to Problem

The present invention includes the following aspects.

[1] A flux including: a rosin ester; an organic acid (A); and a solvent (S), in which the organic acid (A) includes a dimer acid (A1) having a weight reduction rate of 1% by mass or less when heated to 260° C. at a temperature rising rate of 10° C./min in thermogravimetric measurement, and the solvent (S) includes a solvent (S1) having a weight reduction rate of 99% by mass or greater when heated to 150° C. at a temperature rising rate of 6° C./min in the thermogravimetric measurement.

In the present invention, "weight reduction rate" is measured, for example, as follows. 10 mg of a measurement target sample is put into an aluminum pan and heated from room temperature of about 25° C. at a predetermined temperature rising rate until the temperature reaches a predetermined temperature, using a differential thermal-thermogravimetric simultaneous measuring device (TG-DTA8122, manufactured by Rigaku Corporation). Further, the weight reduction rate is calculated from a mass $W_0$ (100% by mass) of the target sample before heating and a mass $W_1$ immediately after the temperature reaches a predetermined temperature, according to the following calculation formula.

$$\text{Weight reduction rate (\%)} = 100 \times \{W_0 - W_1\}/W_0$$

[2] The flux according to [1], in which a content of the dimer acid (A1) is 75% by mass or greater with respect to a total mass of the organic acid (A).

[3] The flux according to [1] or [2], in which a content of the solvent (S1) is 80% by mass or greater with respect to a total mass of the solvent (S).

[4] The flux according to any one of [1] to [3], in which the dimer acid (A1) is at least one selected from the group consisting of dimers to which an unsaturated fatty acid having 18 carbon atoms is bonded.

[5] The flux according to any one of [1] to [4], in which the solvent (S1) has a boiling point of 200° C. or lower.

[6] The flux according to any one of [1] to [5], further including: azoles.

[7] The flux according to any one of [1] to [6], in which a content of the dimer acid (A1) is 10% by mass or greater and 60% by mass or less with respect to a total mass of the flux.

[8] The flux according to any one of [1] to [7], in which a content of the rosin ester is 15% by mass or greater and 60% by mass or less with respect to a total mass of the flux.

[9] A method for producing an electronic component including a semiconductor package, the method including: a step (i) of obtaining a semiconductor package including a bonded object in which a die and a lid are bonded to each other through a thermal interface material (TIM); and a step (ii) of bonding a solder ball to a rear surface of the semiconductor package to obtain an electronic component, in which the TIM is a sheet made of an alloy of indium and silver, the step (i) includes a heating operation (1) of bonding the die and the lid to each other by a reflow method, with the flux of any one of [1] to [8] being interposed on at least one side of between the TIM and the die and between the TIM and the lid, and the step (ii) includes a heating operation (2) of bonding the solder ball and the semiconductor package to each other by the reflow method.

[10] The method for producing an electronic component according to [9], in which the heating operation (1) is carried out under a temperature condition of 150° C. to 250° C., and the heating operation (2) is carried out under a temperature condition of 200° C. to 280° C.

Advantageous Effects of Invention

According to the present invention, it is possible to provide a flux capable of suppressing generation of voids when reflow is continuously carried out under different temperature conditions using an indium alloy sheet.

DESCRIPTION OF EMBODIMENTS (Flux)

Figure 1:
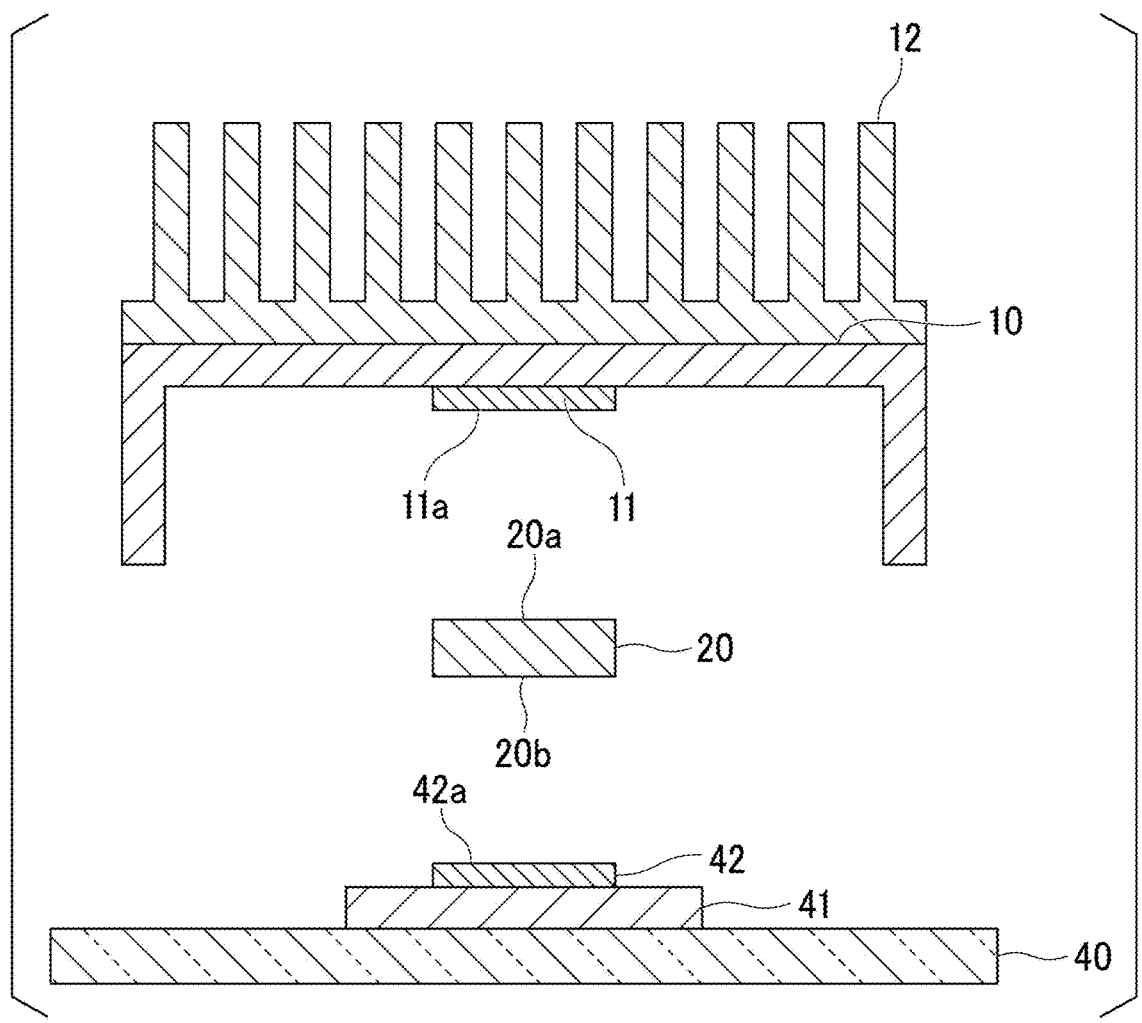
FIG. 1 A cross-sectional view showing a lid, a TIM, and a die in an embodiment of a method for producing an electronic component.

A flux according to the present embodiment contains a rosin ester, an organic acid (A), and a solvent (S).

The organic acid (A) includes a dimer acid (A1) having a weight reduction rate of 1% by mass or less when heated to 260° C. at a temperature rising rate of 10° C./min in the thermogravimetric measurement.

The solvent (S) includes a solvent (S1) having a weight reduction rate of 99% by mass or greater when heated to 150° C. at a temperature rising rate of 6° C./min in the thermogravimetric measurement.

The flux according to the present embodiment is suitably used for applications in which reflow is continuously carried out to mount an indium alloy sheet and bond solder balls.

In the primary reflow, reflow is carried out under a low temperature condition (for example, 170° C.) near a melting point of indium, and the indium alloy sheet is mounted. Next, in the secondary reflow, the solder balls are bonded to the substrate by carrying out reflow under a high temperature condition (for example, 250° C.) near a melting point of a solder alloy.

According to the flux of the present embodiment, the solvent (S1) is volatilized in the primary reflow. As a result, voids derived from the solvent (S1) are not generated when the indium alloy sheet is melted.

In addition, since the rosin ester and the dimer acid (A1) are unlikely to be volatilized even at a high temperature of the secondary reflow, the flux according to the present embodiment makes it possible to suppress the generation of voids.

<Rosin Ester>

The rosin ester is an ester resin obtained by reacting a natural resin or a substance obtained by chemically modifying a natural resin (rosin derivative) with an alcohol. The rosin ester may have a hydroxyl group in addition to a carboxyl group.

Examples of the alcohol include glycerin and pentaerythritol.

Examples of "natural resin" which can be a raw material of the rosin ester include gum rosin, wood rosin, and tall oil rosin.

In the present specification, "natural resin" includes a mixture of abietic acid and an isomer thereof, in which abietic acid is a main component. The total content of the abietic acid and the isomer of the abietic acid in the natural resin is, for example, 40% by mass or greater and 80% by mass or less with respect to the natural resin. In the present specification, the term "main component" denotes a component contained in a compound by an amount of 40% by mass or greater in components constituting the compound.

Examples of typical isomers of abietic acid include neoabietic acid, palustric acid, and levopimaric acid. The structure of abietic acid is shown below.

[Chemical formula 1]

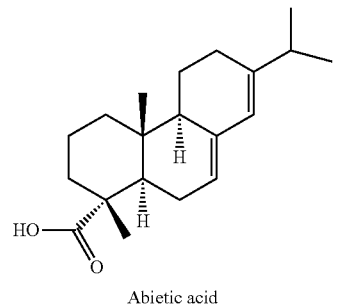

Abietic acid

In the present invention, examples of the "substance obtained by chemically modifying a natural resin (rosin derivative)" which can be a raw material of the rosin ester include a substance obtained by subjecting the "natural resin" to at least one treatment selected from the group consisting of hydrogenation, dehydrogenation, neutralization, alkylene oxide addition, amidation, dimerization, multimerization, and Diets-Alder cycloaddition.

Examples of the rosin derivatives include a purified rosin and a modified rosin.

Examples of the modified rosin include a hydrogenated rosin, a polymerized rosin, a polymerized hydrogenated rosin, a disproportionated rosin, an acid-modified rosin, an acid-modified hydrogenated rosin, an acid anhydride-modified hydrogenated rosin, an acid-modified disproportionated rosin, an acid anhydride-modified disproportionated rosin, a phenol-modified rosin, an α,β-unsaturated carboxylic acid-modified product (such as an acrylic acid-modified rosin, a maleic acid-modified rosin, or a fumaric acid-modified rosin), purified products, hydrides, and disproportionated products of the polymerized rosin, purified products, hydrides, and disproportionated products of the α,β-unsaturated carboxylic acid-modified product, a rosin alcohol, a rosin amine, a hydrogenated rosin alcohol, a rosin soap, a hydrogenated rosin soap, and an acid-modified rosin soap.

Among the rosins, the rosin ester is preferable from the viewpoint of having high heat resistance and a low weight reduction rate.

As the rosin which is a raw material of the rosin ester, a hydrogenated rosin is preferable. As the alcohol which is a raw material of the rosin ester, glycerin is preferable. It is preferable that the rosin ester be one obtained by reacting a hydrogenated rosin with glycerin.

The weight reduction rate of the rosin ester when heated to 260° C. at a temperature rising rate of 10° C./min in the thermogravimetric measurement is preferably 15% by mass or less, more preferably 10% by mass or less, still more preferably 8% by mass or less, and particularly preferably 7.5% by mass or less. It is preferable that the value of the weight reduction rate of the rosin ester be as low as possible. The lower limit of the weight reduction rate of the rosin ester is not particularly limited as long as the effects of the present invention are exhibited, and may be, for example, 0.1% by mass or 0% by mass in terms of measurement.

In a case where the weight reduction rate of the rosin ester is the above-described upper limits or less, the generation of voids when reflow is continuously carried out using an indium alloy sheet is likely to be suppressed.

The acid value of the rosin ester is preferably 0.01 mgKOH/g or greater and 50 mgKOH/g or less, more preferably 0.1 mgKOH/g or greater and 30 mgKOH/g or less, still more preferably 0.5 mgKOH/g or greater and 20 mgKOH/g or less, and particularly preferably 2 mgKOH/g or greater and 10 mgKOH/g or less.

In a case where the acid value of the rosin ester is the lower limits or greater of the above-described ranges, the activity of the flux is likely to be increased. In a case where the acid value of the rosin ester is the upper limits or less of the above-described ranges, the solder meltability and the wettability are likely to be enhanced.

The acid value denotes the number of milligrams of potassium hydroxide required to neutralize a carboxy group contained in 1 g of a measurement target sample. The acid value of the rosin ester can be measured, for example, in conformity with 3.1 Neutralization Titration Method of JIS K 0070 "Test Method for Acid Value, Saponification Value, Ester Value, Iodine Value, Hydroxyl Value, and Unsaponifiable Substance of Chemical Products".

The acid value measured by this method is a weighted average of acid values of all kinds of rosin esters contained in the flux.

The softening point of the rosin ester is preferably 85° C. or higher and 110° C. or lower, more preferably 90° C. or higher and 105° C. or lower, and still more preferably 90° C. or higher and 100° C. or lower.

In a case where the softening point of the rosin ester is the lower limits or higher of the above-described ranges, the heat resistance of the rosin ester is likely to be increased. In a case where the softening point of the rosin ester is the upper limits or lower of the above-described ranges, the fluidity of the flux is likely to be increased during solder melting.

The softening point of the rosin ester can be measured by a ring and ball method. Examples of the ring and ball method include a method described in JIS K 5902.

One type of the rosin ester may be used alone or a mixture of at least two types thereof may be used.

The content of the rosin ester in the flux is preferably 10% by mass or greater and 70% by mass or less and more preferably 15% by mass or greater and 60% by mass or less with respect to the total mass (100% by mass) of the flux.

<Organic Acid (A)>

The organic acid (A) contained in the flux according to the present embodiment includes a dimer acid (A1). The organic acid (A) contained in the flux according to the present embodiment may include other organic acids in addition to the dimer acid (A1).

<<Dimer Acid (A1)>>

The weight reduction rate of the dimer acid (A1) when heated to 260° C. at a temperature rising rate of 10° C./min in the thermogravimetric measurement is 1% by mass or less, preferably 0.8% by mass or less, more preferably 0.6% by mass or less, still more preferably 0.4% by mass or less, particularly preferably 0.3% by mass or less, and most preferably 0.2% by mass or less.

It is preferable that the value of the weight reduction rate of the dimer acid (A1) be as low as possible. The lower limit of the weight reduction rate of the dimer acid (A1) is not particularly limited as long as the effect of the present invention is exhibited, and may be, for example, 0.01% by mass or 0% by mass in terms of measurement.

The dimer acid (A1) contains a dibasic acid obtained by dimerization of an unsaturated fatty acid as a main component. The dimer acid (A1) includes a hydrogenated dimer acid formed by hydrogenating a dibasic acid obtained by dimerization of an unsaturated fatty acid.

It is preferable that the unsaturated fatty acid which is a raw material of the dimer acid (A1) has 18 carbon atoms. The dibasic acid which is a main component of the dimer acid (A1) is preferably a dibasic acid having 36 carbon atoms and more preferably at least one selected from the group consisting of dimers to which an unsaturated fatty acid having 18 carbon atoms is bonded.

Examples of the unsaturated fatty acid which is a raw material of the dimer acid (A1) include oleic acid, linoleic acid, vaccenic acid, elaidic acid, linolenic acid, acrylic acid, and methacrylic acid.

The unsaturated fatty acid which is a raw material of the dimer acid (A1) is preferably one or more selected from the group consisting of oleic acid, linoleic acid, vaccenic acid, and elaidic acid and more preferably one or more selected from the group consisting of oleic acid and linoleic acid.

One type of the dimer acid (A1) may be used alone or a mixture of at least two types thereof may be used.

The dimer acid (A1) may have an unsaturated hydrocarbon group, an alicyclic hydrocarbon group, an aromatic hydrocarbon group, or the like. The unsaturation degree of the dimer acid (A1) may be a value as described below. Here, the unsaturation degree of the dimer acid (A1) is a value calculated in accordance with the formula: $\{(2m+2)-n\}/2$, in which m is the number of carbon atoms in a molecule of the dimer acid (A1) and n is the number of hydrogen atoms therein. The dibasic acid which is the main component of the dimer acid (A1) has two carboxy groups. The unsaturation degree of the dibasic acid is 2 or greater.

The unsaturation degree of the dimer acid (A1) is preferably 2 or greater and 20 or less, more preferably 2 or greater and 15 or less, still more preferably 2 or greater and 10 or less, and particularly preferably 2 or greater and 8 or less.

In a case where the dimer acid (A1) includes two or more types of dimer acids having different unsaturation degrees, the unsaturation degree obtained by weight-averaging the unsaturation degrees thereof is preferably 2 or greater and 10 or less, more preferably 2 or greater and 8 or less, still more preferably 2 or greater and 6 or less, particularly preferably 2.5 or greater and 4.5 or less, and most preferably 3 or greater and 4 or less.

One type of the dimer acid (A1) may be used alone or a mixture of at least two types thereof may be used.

The content of the dimer acid (A1) is preferably 5% by mass or greater and 70% by mass or less, more preferably 10% by mass or greater and 60% by mass or less, and still more preferably 15% by mass or greater and 60% by mass or less with respect to the total mass (100% by mass) of the flux.

In a case where the content of the dimer acid (A1) is in the above-described ranges, the generation of voids when the reflow is continuously carried out using the indium alloy sheet can be suppressed. In addition, in a case where the content of the dimer acid (A1) is the lower limits or greater of the above-described ranges, the wettability with respect to the indium alloy sheet is likely to be increased.

The total content of the dimer acids having 36 carbon atoms is preferably 70% by mass or greater and 100% by mass or less, more preferably 80% by mass or greater and 100% by mass or less, still more preferably 90% by mass or greater and 100% by mass or less, particularly preferably 95% by mass or greater and 100% by mass or less, and most preferably 98% by mass or greater and 100% by mass or less with respect to the total mass (100% by mass) of the dimer acid (A1), and may be 100% by mass in terms of measurement.

In a case where the dimer acid (A1) includes plural types of dimer acids, each dimer acid can be analyzed using a liquid chromatography Fourier transform mass spectrometer. In a created ion chromatogram, the proportion of the peak area derived from each of the dimer acids having 36 carbon atoms with respect to the total peak area (100%) derived from all molecules contained in the dimer acid (A1) preferably falls within the following ranges.

The peak area derived from the dimer acid having an unsaturation degree of 2 is preferably 5% or greater and 50% or less, more preferably 15% or greater and 40% or less, and still more preferably 20% or greater and 30% or less.

The proportion of the peak area of the dimer acid having an unsaturation degree of 3 is preferably 10% or greater and 70% or less, more preferably 20% or greater and 60% or less, and still more preferably 30% or greater and 50% or less.

The proportion of the peak area of the dimer acid having an unsaturation degree of 4 is preferably 2% or greater and 30% or less, more preferably 3% or greater and 20% or less, and still more preferably 5% or greater and 15% or less.

The proportion of the peak area of the dimer acid having an unsaturation degree of 5 is preferably 0.1% or greater and 15% or less, more preferably 0.5% or greater and 10% or less, and still more preferably 1% or greater and 5% or less.

The proportion of the peak area of the dimer acid having an unsaturation degree of 6 is preferably 1% or greater and 30% or less, more preferably 2% or greater and 20% or less, and still more preferably 3% or greater and 15% or less.

The proportion of the peak area of the dimer acid having an unsaturation degree of 7 is preferably 2% or greater and 30% or less, more preferably 3% or greater and 20% or less, and still more preferably 5% or greater and 15% or less.

The proportion of the peak area of the dimer acid having an unsaturation degree of 8 is preferably 0.1% or greater and 15% or less, more preferably 0.5% or greater and 10% or less, and still more preferably 1% or greater and 5% or less.

Alternatively, in a case where the dimer acid (A1) includes plural types of dimer acids having 36 carbon atoms, the content of the dimer acids having 36 carbon atoms with respect to the total mass (100% by mass) of the dimer acid (A1) preferably falls within the following ranges.

The content of the dimer acid having an unsaturation degree of 2 is preferably 5% by mass or greater and 50% by mass or less, more preferably 15% by mass or greater and 40% by mass or less, and still more preferably 20% by mass or greater and 30% by mass or less.

The content of the dimer acid having an unsaturation degree of 3 is preferably 10% by mass or greater and 70% by mass or less, more preferably 20% by mass or greater and 60% by mass or less, and still more preferably 30% by mass or greater and 50% by mass or less.

The content of the dimer acid having an unsaturation degree of 4 is preferably 2% by mass or greater and 30% by mass or less, more preferably 3% by mass or greater and 20% by mass or less, and still more preferably 5% by mass or greater and 15% by mass or less.

The content of the dimer acid having an unsaturation degree of 5 is preferably 0.1% by mass or greater and 15% by mass or less, more preferably 0.5% by mass or greater and 10% by mass or less, and still more preferably 1% by mass or greater and 5% by mass or less.

The content of the dimer acid having an unsaturation degree of 6 is preferably 1% by mass or greater and 30% by mass or less, more preferably 2% by mass or greater and 20% by mass or less, and still more preferably 3% by mass or greater and 15% by mass or less.

The content of the dimer acid having an unsaturation degree of 7 is preferably 2% by mass or greater and 30% by mass or less, more preferably 3% by mass or greater and 20% by mass or less, and still more preferably 5% by mass or greater and 15% by mass or less.

The content of the dimer acid having an unsaturation degree of 8 is preferably 0.1% by mass or greater and 15% by mass or less, more preferably 0.5% by mass or greater and 10% by mass or less, and still more preferably 1% by mass or greater and 5% by mass or less.

<<Other Organic Acids>>

Examples of other organic acid include a carboxylic acid and an organic sulfonic acid. Examples of the carboxylic acid include an aliphatic carboxylic acid and an aromatic carboxylic acid. Examples of the aliphatic carboxylic acid include an aliphatic monocarboxylic acid and an aliphatic dicarboxylic acid.

Examples of the aliphatic monocarboxylic acid include caproic acid, enanthic acid, caprylic acid, pelargonic acid, isopelargonic acid, capric acid, caproleic acid, lauric acid (dodecanoic acid), undecanoic acid, linderic acid, tridecanoic acid, myristoleic acid, pentadecanoic acid, palmitic acid, isopalmitic acid, palmitoleic acid, hiragonic acid, hydnocarpic acid, margaric acid, isostearic acid, elaidic acid, petroselinic acid, moroctic acid, eleostearic acid, tariric acid, vaccenic acid, ricinoleic acid, vernolic acid, sterculynic acid, nonadecanoic acid, eicosanoic acid, stearic acid, 12-hydroxystearic acid, oleic acid, linoleic acid, linolenic acid, and myristic acid.

Examples of the aliphatic dicarboxylic acid include oxalic acid, malonic acid, succinic acid, glutaric acid, adipic acid, pimelic acid, suberic acid, azelaic acid, sebacic acid, dodecanedioic acid, eicosanedioic acid, tartaric acid, 2,4-diethylglutaric acid, diglycolic acid, 2-methylnonanedioic acid, 4-(methoxycarbonyl)-2,4-dimethylundecanedioic acid, 4,6-bis(methoxycarbonyl)-2,4,6-trimethyltridecanedioic acid, and 8,9-bis(methoxycarbonyl)-8,9-dimethylhexadecanedioic acid.

Examples of the aromatic carboxylic acid include salicylic acid, dibutyl aniline diglycolic acid, terephthalic acid, parahydroxy phenyl acetic acid, phenyl succinic acid, phthalic acid, benzoic acid, 2,3-dihydroxybenzoic acid, 2-quinoline carboxylic acid, 3-hydroxybenzoic acid, p-anisic acid, picolinic acid, dipicolinic acid, and 3-hydroxypicolinic acid.

Additional examples of the carboxylic acid include tris (2-carboxyethyl) isocyanurate, and 1,3-cyclohexanedicarboxylic acid.

Additional examples of other organic acids include hydroxycarboxylic acid. Examples of the hydroxycarboxylic acid include 2,2-bis(hydroxymethyl)propionic acid, 2,2-bis(hydroxymethyl)butanoic acid, citric acid, isocitric acid, malic acid, and tartaric acid, and 2,2-bis(hydroxymethyl) propionic acid is preferable.

Additional examples of the carboxylic acid include other dimer acids (here, the dimer acid (A1) is excluded). The term "other dimer acids" (here, the dimer acid (A1) is excluded) encompasses a hydrogenated dimer acid (here, the dimer acid (A1) is excluded). The weight reduction rate of other dimer acids when heated to 260° C. at a temperature rising rate of 10° C./min in the thermogravimetric measurement exceeds 1% by mass. Examples of raw materials of other dimer acids include those of the dimer acid (A1) described above.

Additional examples of the carboxylic acid include trimer acid. The trimer acid contains a tribasic acid obtained by trimerization of an unsaturated fatty acid as a main component. The term "trimer acid" encompasses a hydrogenated trimer acid. Examples of the raw material of the trimer acid include those of the dimer acid (A1) described above.

Examples of the organic sulfonic acid include an aliphatic sulfonic acid, and an aromatic sulfonic acid. Examples of the aliphatic sulfonic acid include an alkanesulfonic acid and an alkanolsulfonic acid.

One type of the other organic acids may be used alone or a mixture of at least two types thereof may be used.

As other organic acids, a carboxylic acid is preferable, and at least one selected from the group consisting of aliphatic monocarboxylic acids and an aliphatic dicarboxylic acids is preferable.

In a case where the flux contains other organic acids, the content of the other organic acids is preferably greater than 0% by mass and 10% by mass or less, more preferably greater than 0% by mass and 5% by mass or less, still more preferably greater than 0% by mass and 1.5% by mass or less, and particularly preferably greater than 0% by mass and 1% by mass or less with respect to the total mass of the flux.

In a case where the content of the other organic acids is the upper limits or less of the above-described ranges, the generation of voids when the reflow is continuously carried out using the indium alloy sheet is likely to be suppressed.

The content of the dimer acid (A1) is preferably 75% by mass or greater, more preferably 75% by mass or greater and 100% by mass or less, still more preferably 85% by mass or greater and 100% by mass or less, and particularly preferably 90% by mass or greater and 100% by mass or less with respect to the total mass of the organic acid (A).

In a case where the content of the dimer acid (A1) is the lower limits or greater of the above-described ranges, the generation of voids when the reflow is continuously carried out using the indium alloy sheet is likely to be suppressed.

<Solvent (S)>

The solvent (S) contained in the flux according to the present embodiment includes a solvent (S1). The solvent (S) may include a solvent (S2) in addition to the solvent (S1).

<<Solvent (S1)>>

The weight reduction rate of the solvent (S1) when heated to 150° C. at a temperature rising rate of 6° C./min in the thermogravimetric measurement is 99% by mass or greater.

The upper limit of the weight reduction rate of the solvent (S1) is not particularly limited as long as the effects of the present invention are exhibited, and may be, for example, 100% by mass.

Examples of the solvent (S1) include 3-methoxybutyl acetate, 2-methyl-2,4-pentanediol (hexylene glycol), 2-propanol, 1,2-butanediol, 2,3-butanediol, 2,3-dimethyl-2,3-butanediol, 2-methylpentane-2,4-diol, 1-ethynyl-1-cyclohexanol, 1,4-cyclohexanediol, and ethylene glycol monobutyl ether (butyl glycol), and at least one selected from the group consisting of 3-methoxybutyl acetate and 2-methyl-2,4-pentanediol (hexylene glycol) is preferable.

The boiling point of the solvent (S1) is preferably 200° C. or lower, more preferably 150° C. or higher and 200° C. or lower, and still more preferably 170° C. or higher and 200° C. or lower.

In the present specification, the boiling point denotes a temperature of a liquid when a saturated vapor pressure of a target liquid is equal to 1 atm (namely, 1013 hPa).

One type of the solvent (S1) may be used alone or a mixture of at least two types thereof may be used.

The total content of the solvent (S1) is preferably 10% by mass or greater and 90% by mass or less, more preferably 15% by mass or greater and 85% by mass or less, and still more preferably 20% by mass or greater and 75% by mass or less with respect to the total mass (100% by mass) of the flux.

<<Solvent (S2)>>

The weight reduction rate of the solvent (S2) when heated to 150° C. at a temperature rising rate of 6° C./min in the thermogravimetric measurement is less than 99% by mass.

The lower limit of the weight reduction rate of the solvent (S2) is not particularly limited as long as the effects of the present invention are exhibited, and may be, for example, 10% by mass.

The boiling point of the solvent (S2) is preferably higher than 200° C. and 350° C. or lower, more preferably 250° C. or higher and 350° C. or lower, and still more preferably 250° C. or higher and 330° C. or lower.

Examples of the solvent (S2) include an alcohol-based solvent, a glycol ether-based solvent, and terpineols.

Examples of the alcohol-based solvent include 1,3-butanediol, 1,4-butanediol, isobornyl cyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 1,1,1-tris(hydroxymethyl)propane, 2-ethyl-2-hydroxymethyl-1,3-propanediol, 2,2'-oxybis(methylene)bis(2-ethyl-1, 3-propanediol), 2,2-bis(hydroxymethyl)-1,3-propanediol, 1,2,6-trihydroxyhexane, 1,4-cyclohexanedimethanol, 2,4,7,9-tetramethyl-5-decyne-4,7-diol, and 2-hexyl-1-decanol octanediol.

Examples of the glycol ether-based solvent include diethylene glycol mono-2-ethylhexyl ether, ethylene glycol monophenyl ether, ethylene glycol monohexyl ether (hexyl glycol), diethylene glycol monohexyl ether (hexyl diglycol), diethylene glycol dibutyl ether, triethylene glycol monobutyl ether, methyl propylene triglycol, triethylene glycol butyl methyl ether, tetraethylene glycol, tetraethylene glycol dimethyl ether, and tripropylene glycol-n-butyl ether.

Examples of the terpineols include α-terpineol, β-terpineol, γ-terpineol, and a terpineol mixture (that is, a mixture containing α-terpineol as a main component and (β-teipineol or γ-teipineol).

Additional examples of the solvent include dioctyl sebacate (DOS) and liquid paraffin.

One type of the solvent (S2) may be used alone or a mixture of at least two types thereof may be used.

The total content of the solvent (S) is preferably 10% by mass or greater and 90% by mass or less and more preferably 20% by mass or greater and 75% by mass or less with respect to the total mass (100% by mass) of the flux.

The content of the solvent (S1) is preferably 70% by mass or greater, more preferably 70% by mass or greater and 100% by mass or less, still more preferably 80% by mass or greater and 100% by mass or less, particularly preferably 85% by mass or greater and 100% by mass or less, and most preferably 90% by mass or greater and 100% by mass or less with respect to the total mass of the solvent (S).

In a case where the content of the solvent (S1) is the lower limits or greater of the above-described ranges, the generation of voids when the reflow is continuously carried out using the indium alloy sheet is likely to be suppressed.

<Other Components>

The flux according to the present embodiment may contain other components as necessary in addition to the rosin ester, the organic acid (A), and the solvent (S). Examples of other components include rosins other than the rosin ester, activators other than the organic acid (A), thixotropic agents, metal deactivators, surfactants, silane coupling agents, antioxidants, and colorants.

<<Other Rosins>>

Examples of the other rosins include the above-described natural resin and a rosin derivative (here, a rosin ester is excluded) obtained by chemically modifying the natural resin.

In the present specification, the expression "rosin derivative (here, a rosin ester is excluded) obtained by chemically modifying the natural resin" encompasses a substance obtained by subjecting the above-mentioned "natural resin" to at least one treatment selected from the group consisting of hydrogenation, dehydrogenation, neutralization, alkylene oxide addition, amidation, dimerization, multimerization, and Diets-Alder cycloaddition on.

Examples of the rosin derivatives include a purified rosin and a modified rosin.

Examples of the modified rosin include a hydrogenated rosin, a polymerized rosin, a polymerized hydrogenated rosin, a disproportionated rosin, an acid-modified rosin, an acid-modified hydrogenated rosin, an acid anhydride-modified hydrogenated rosin, an acid-modified disproportionated rosin, an acid anhydride-modified disproportionated rosin, a phenol-modified rosin, an α,β-unsaturated carboxylic acid-modified product (such as an acrylic acid-modified rosin, a maleic acid-modified rosin, or a fumaric acid-modified rosin), purified products, hydrides, and disproportionated products of the polymerized rosin, purified products, hydrides, and disproportionated products of the α,β-unsaturated carboxylic acid-modified product, a rosin alcohol, a rosin amine, a hydrogenated rosin alcohol, a rosin soap, a hydrogenated rosin soap, and an acid-modified rosin soap.

The rosin amine is, for example, a mixture of dehydroabietylamine, dihydroabietylamine, and tetrahydroabietylamine, and denotes a so-called disproportionated rosin amine. The structures of each of dehydroabietylamine, dihydroabietylamine, and tetrahydroabietylamine are shown below.

[Chemical formula 2]

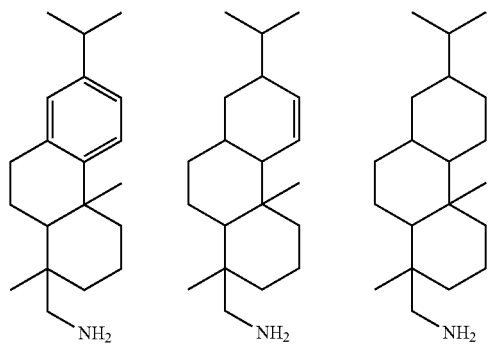

Dehydroabietylamine  Dihydroabietylamine  Tetrahydroabietylamine

One type of the other rosins may be used alone or a mixture of at least two types thereof may be used.

The content of the rosin ester is preferably 70% by mass or greater and 100% by mass or less, more preferably 80% by mass or greater and 100% by mass or less, still more preferably 90% by mass or greater and 100% by mass or less, particularly preferably 95% by mass or greater and 100% by mass or less, and may be 100% by mass with respect to the total mass (100% by mass) of the rosin.

In a case where the content of the rosin ester is the lower limits or less of the above-described ranges, the generation of voids when the reflow is continuously carried out using the indium alloy sheet is likely to be suppressed.

<<Other Activators>>

Examples of the other activators include an amine, a halogen compound, and an organic phosphorus compound.

[Amine]

Examples of the amine include azoles, guanidines, alkanolamines, alkylamine compounds, and amine-polyoxyalkylene adducts.

Examples of the azoles include 2-methylimidazole, 2-ethylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzimidazolium chloride, 2-methylimidazoline, 2-phenylimidazoline, 2,4-diamino-6-vinyl-s-triazine, a 2,4-diamino-6-vinyl-s-triazine isocyanuric acid adduct, 2,4-diamino-6-methacryloyloxyethyl-s-triazine, an epoxy-imidazole adduct,2-methylbenzimidazole, 2-octylbenzimidazole, 2-pentylbenzimidazole, 2-(1-ethylpentyl) benzimidazole, 2-nonylbenzimidazole, 2-(4-thiazolyl)benzimidazole, benzimidazole, 1,2,4-triazole, 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-amylphenyl)benzotriazole, 2-(2'-hydroxy-5'-tert-octylphenyl)benzotriazole, 2,2'-methylenebis[6-(2H-benzotriazol-2-yl)-4-tert-octylphenol], 6-(2-benzotriazolyl)-4-tert-octyl-6'-tert-butyl-4'-methyl-2,2'-methylene bisphenol, 1,2,3-benzotriazole, 1-[N,N-bis(2-ethylhexyl) aminomethyl]benzotriazole, carboxybenzotriazole, 1-[N,N-bis(2-ethylhexyl)aminomethyl]methylbenzotriazole, 2,2'-[[methyl-1H-benzotriazol-1-yl)methyl]imino]bisethanol, 1-(1',2'-dicarboxyethyl)benzotriazole, 1-(2,3-dicarboxypropyl)benzotriazole, 1-[(2-ethylhexylamino)methyl]benzotriazole, 2,6-bis[(1H-benzotriazol-1-yl)methyl]-4-methylphenol, 5-methylbenzotriazole, and 5-phenyltetrazole.

Examples of the guanidines include 1,3-diphenylguanidine, 1,3-di-o-tolylguanidine, 1-o-tolylbiguanide, 1,3-di-o-cumenylguanidine, and 1,3-di-o-cumenyl-2-propionylguanidine.

Examples of the alkanolamine include N,N,N',N'-tetrakis (2-hydroxypropyl)ethylenediamine, N,N,N',N'-tetrakis(2-hydroxyethyl)ethylenediamine, monoethanolamine, diethanolamine, triethanolamine, 1-amino-2-propanol, bis(2-hydroxypropyl)amine, and tris(2-hydroxypropyl)amine.

Examples of the alkylamine compound include ethylamine, triethylamine, ethylenediamine, triethylenetetramine, cyclohexylamine, hexadecylamine, and stearylamine.

Examples of the amine-polyoxyalkylene adducts include diamine-terminated polyalkylene glycols, aliphatic amine-polyoxyalkylene adducts, aromatic amine-polyoxyalkylene adducts, and polyvalent amine-polyoxyalkylene adducts.

Examples of alkylene oxides added to the amine-polyoxyalkylene adducts include ethylene oxides, propylene oxides, and butylene oxides.

The diamine-terminated polyalkylene glycol is a compound in which both terminals of polyalkylene glycol are aminated.

Examples of the diamine-terminated polyalkylene glycols include diamine-terminated polyethylene glycols, diamine-terminated polypropylene glycols, and diamine-terminated polyethylene glycol-polypropylene glycol copolymers.

Examples of the diamine-terminated polyethylene glycol-polypropylene glycol copolymers include a bis(2-aminopropyl) ether polyethylene glycol-polypropylene glycol copolymer and a bis(2-aminoethyl) ether polyethylene glycol-polypropylene glycol copolymer.

The aliphatic amine-polyoxyalkylene adducts, the aromatic amine-polyoxyalkylene adducts, and the polyvalent amine-polyoxyalkylene adducts are those in which polyoxyalkylene groups are bonded to the nitrogen atoms of amines. Examples of the amines include ethylenediamine, 1,3-propanediamine, 1,4-butanediamine, hexamethylenediamine, diethylenetriamine, laurylamine, stearylamine, oleylamine, beef tallow amine, cured beef tallow amine, beef tallow propyldiamine, meta-xylenediamine, tolylenediamine, para-xylenediamine, phenylenediamine, isophoronediamine, 1,10-decanediamine, 1,12-dodecanediamine, 4,4-diaminodicyclohexylmethane, 4,4-diaminodiphenylmethane, butane-1,1,4,4-tetramine, and pyrimidine-2,4,5,6-tetramine.

One type of the amine may be used alone or a mixture of at least two types thereof may be used.

As the amine, azoles are preferable, and 2-phenylimidazole is more preferable.

In a case where the flux contains an amine, the content of the amine is preferably 0.1% by mass or greater and 10% by mass or less and more preferably 0.1% by mass or greater and 5% by mass or less with respect to the total mass of the flux.

In a case where the flux contains an amine, the wettability of the flux is likely to be enhanced. In a case where the content of the amine is the lower limits or greater of the above-described ranges, the wettability of the flux is likely to be enhanced. In a case where the content of the amine is the upper limits or less of the above-described ranges, the suppressibility of generation of voids is likely to be enhanced.

[Halogen Compound]

Examples of the halogen compound include an amine hydrohalic acid salt, and organic halogen compounds other than the amine hydrohalic acid salt.

The amine hydrohalic acid salt is a compound obtained by reacting an amine with a hydrogen halide.

Examples of the amine herein include those described above in the section of <<Amine>>.

In addition, as the halogen compound other than the amine hydrohalic acid salt, for example, a salt obtained by reacting an amine with tetrafluoroboric acid ($HBF_4$) or a complex obtained by reacting an amine with boron trifluoride ($BF_3$) can also be used. Examples of the complex include boron trifluoride piperidine.

Examples of the halogen compound other than the amine hydrohalic acid salt include a halogenated aliphatic compound. The halogenated aliphatic hydrocarbon group denotes a group in which some or all hydrogen atoms constituting the aliphatic hydrocarbon group are substituted with halogen atoms.

Examples of the halogenated aliphatic compound include halogenated aliphatic alcohol and a halogenated heterocyclic compound.

Examples of the halogenated aliphatic alcohol include 1-bromo-2-propanol, 3-bromo-1-propanol, 3-bromo-1,2-propanediol, 1-bromo-2-butanol, 1,3-dibromo-2-propanol, 2,3-dibromo-1-propanol, 1,4-dibromo-2-butanol, and trans-2,3-dibromo-2-butene-1,4-diol.

Examples of the halogenated heterocyclic compounds include a compound of General Formula (h1).

$$R^{h11}-(R^{h12})_n \quad \text{(h1)}$$

[In the formula, $R^{h11}$ is an n-valent heterocyclic group. $R^{h12}$ is a halogenated aliphatic hydrocarbon group.]

Examples of the heterocyclic ring of the n-valent heterocyclic group as $R^{h11}$ include a ring structure in which some of the carbon atoms constituting an aliphatic hydrocarbon or an aromatic hydrocarbon ring are substituted with heteroatoms. Examples of the heteroatom in the heterocyclic ring include an oxygen atom, a sulfur atom, and a nitrogen atom. This heterocyclic ring is preferably a 3- to 10-membered ring and more preferably a 5- to 7-membered ring. Examples of the heterocyclic ring include an isocyanurate ring.

The halogenated aliphatic hydrocarbon group as $R^{h12}$ has preferably 1 to 10 carbon atoms, more preferably 2 to 6 carbon atoms, and still more preferably 3 to 5 carbon atoms. In addition, $R^{h12}$ is preferably a brominated aliphatic hydrocarbon group or a chlorinated aliphatic hydrocarbon group, more preferably a brominated aliphatic hydrocarbon group, and still more preferably a brominated saturated aliphatic hydrocarbon group.

Examples of the halogenated heterocyclic compound include tris-(2,3-dibromopropyl)isocyanurate.

Additional examples of the halogen compound other than the amine hydrohalic acid salt include halogenated carboxyl compounds such as iodinated carboxyl compounds such as 2-iodobenzoic acid, 3-iodobenzoic acid, 2-iodopropionic acid, 5-iodosalicylic acid, and 5-iodoanthranilic acid; chlorinated carboxyl compounds such as 2-chlorobenzoic acid and 3-chloropropionic acid; and brominated carboxyl compounds such as 2,3-dibromopropionic acid, 2,3-dibromosuccinic acid, and 2-bromobenzoic acid.

Additional examples of the halogen compound other than the amine hydrohalic acid salt include an organic chloro compound. Examples of the organic chloro compound include chloroalkane, chlorinated fatty acid ester, chlorendic acid, and a chlorendic anhydride.

One type of the halogen compound may be used alone or a mixture of at least two types thereof may be used.

<<Organic Phosphorus Compound>>

Examples of the organic phosphorus compound include acidic phosphoric acid ester, acidic phosphonic acid ester, and acidic phosphinic acid ester.

One type of the organic phosphorus compound may be used alone or a mixture of at least two types thereof may be used.

<<Thixotropic Agent>>

Examples of the thixotropic agents include an ester-based thixotropic agent, an amide-based thixotropic agent, and a sorbitol-based thixotropic agent.

Examples of the ester-based thixotropic agent include an ester compound, and specific examples thereof include cured castor oil and ethyl myristate.

Examples of the amide-based thixotropic agent include monoamide, bisamide, and polyamide.

Examples of the monoamide include lauric acid amide, palmitic acid amide, stearic acid amide, behenic acid amide, hydroxystearic acid amide, saturated fatty acid amide, oleic acid amide, elaidic acid amide, unsaturated fatty acid amide, 4-methylbenzamide (p-toluamide), p-toluene methanamide, aromatic amide, hexamethylene hydroxystearic acid amide, substituted amide, methylol stearic acid amide, methylolamide, and fatty acid ester amide.

Examples of the bisamide include ethylenebis fatty acid (C6-24 fatty acid) amide, ethylenebis hydroxy fatty acid (C6-24 fatty acid) amide, hexamethylenebis fatty acid (C6-24 fatty acid) amide, hexamethylenebis hydroxy fatty acid (C6-24 fatty acid) amide, and aromatic bisamide. Examples of the fatty acids that are raw materials of the bisamide include stearic acid (having 18 carbon atoms), oleic acid (having 18 carbon atoms), and lauric acid (having 12 carbon atoms).

Examples of the polyamides include polyamides such as saturated fatty acid polyamides, unsaturated fatty acid polyamides, aromatic polyamides, 1,2,3-propanetricarboxylic acid tris(2-methylcyclohexylamide), cyclic amide oligomers, and acyclic amide oligomers.

Examples of the above-described cyclic amide oligomers include an amide oligomer in which a dicarboxylic acid and a diamine are cyclically polycondensed, an amide oligomer in which a tricarboxylic acid and a diamine are cyclically polycondensed, an amide oligomer in which a dicarboxylic acid and a triamine are cyclically polycondensed, an amide oligomer in which a tricarboxylic acid and a triamine are cyclically polycondensed, an amide oligomer in which a dicarboxylic acid, a tricarboxylic acid, and a diamine are cyclically polycondensed, an amide oligomer in which a dicarboxylic acid, a tricarboxylic acid, and a triamine are cyclically polycondensed, an amide oligomer in which a dicarboxylic acid, a diamine and a triamine are cyclically polycondensed, an amide oligomer in which a tricarboxylic acid, a diamine and a triamine are cyclically polycondensed, and an amide oligomer in which a dicarboxylic acid, a tricarboxylic acid, a diamine and a triamine are cyclically polycondensed.

Further, examples of the above-described acyclic amide oligomers include an amide oligomer in which a monocarboxylic acid, and a diamine and/or a triamine are acyclically polycondensed and an amide oligomer in which a dicarboxylic acid and/or a tricarboxylic acid, and a monoamine are acyclically polycondensed. In the case of an amide oligomer containing a monocarboxylic acid or a monoamine, the monocarboxylic acid and the monoamine serve as terminal molecules to form an acyclic amide oligomer having a reduced molecular weight. Further, in a case where the acyclic amide oligomer is an amide compound in which a dicarboxylic acid and/or a tricarboxylic acid, and a diamine and/or a triamine are acyclically polycondensed, an acyclic polymer-based amide polymer is obtained. Further, examples of the acyclic amide oligomer also include an amide oligomer in which a monocarboxylic acid and a monoamine are acyclically condensed.

Examples of the sorbitol-based thixotropic agent include dibenzylidene-D-sorbitol, bis(4-methylbenzylidene)-D-sorbitol, (D-)sorbitol, monobenzylidene(-D-)sorbitol, and mono(4-methylbenzylidene)-(D-)sorbitol.

The flux according to the present embodiment may or may not contain a thixotropic agent. In a case where the flux according to the present embodiment contains the thixotropic agent, one type of the thixotropic agent may be used alone or a mixture of at least two types thereof may be used.

<<Metal Deactivator>>

Examples of the metal deactivator include hindered phenol-based compounds and nitrogen compounds.

The term "metal deactivator" herein denotes a compound having a property of preventing a metal from deteriorating due to contact with a certain type of compound.

The hindered phenol-based compound denotes a phenol-based compound having a bulky substituent (for example, a branched or cyclic alkyl group such as a t-butyl group) on at least one of the ortho positions of phenol. The hindered phenol-based compound is not particularly limited, and examples thereof include bis[3-(3-tert-butyl-4-hydroxy-5-methylphenyl)propionic acid][ethylenebis(oxyethylene)], N,N'-hexamethylenebis[3-(3,5-di-tert-butyl-4-hydroxyphenyl)propanamide], 1,6-hexanediol bis[3-(3,5-di-tert-butyl-4-hydroxyphenyl)propionate], 2,2'-dihydroxy-3,3'-bis(α-methylcyclohexyl)-5,5'-dimethyldiphenylmethane, 2,2'-methylenebis(6-tert-butyl-p-cresol), 2,2'-methylenebis(6-tert-butyl-4-ethylphenol), triethylene glycol-bis[3-(3-tert-butyl-5-methyl-4-hydroxyphenyl)propionate], 1,6-hexanediol-bis-[3-(3,5-di-tert-butyl-4-hydroxyphenyl) propionate], 2,4-bis-(n-octylthio)-6-(4-hydroxy-3,5-di-t-butylanilino)-1,3,5-triazine, pentaerythrityl-tetrakis[3-(3,5-di-tert-butyl-4-hydroxyphenyl)propionate], 2,2-thio-diethylenebis[3-(3,5-di-tert-butyl-4-hydroxyphenyl)propionate], octadecyl-3-(3,5-di-tert-butyl-4-hydroxyphenyl)propionate, N,N'-hexamethylenebis(3,5-di-t-butyl-4-hydroxyhydrocinnamamide), 3,5-di-tert-butyl-4-hydroxybenzyl-phosphonate-diethyl ester, 1,3,5-trimethyl-2,4,6-tris(3,5-di-tert-butyl-4-hydroxybenzyl)benzene, N,N'-bis[2-[2-(3,5-di-tert-butyl-4-hydroxyphenyl)ethylcarbonyloxy]ethyl]oxamide, and a compound of the following chemical formula.

[Chemical formula 3]

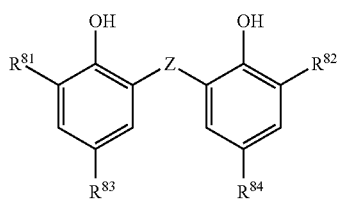

(In the formula, Z is an alkylene group which may be substituted. $R^{81}$ and $R^{82}$ are each independently an alkyl group, an aralkyl group, an aryl group, a heteroaryl group, a cycloalkyl group, or a heterocycloalkyl group, which may be substituted. $R^{83}$ and $R^{84}$ are each independently an alkyl group that may be substituted.)

Examples of the nitrogen compound as the metal deactivator include hydrazide-based nitrogen compounds, amide-based nitrogen compounds, triazole-based nitrogen compounds, and melamine-based nitrogen compounds.

The hydrazide-based nitrogen compound may be a nitrogen compound having a hydrazide skeleton, and examples thereof include dodecanedioic acid bis[N2-(2-hydroxybenzoyl)hydrazide], N,N'-bis[3-(3,5-di-tert-butyl-4-hydroxyphenyl)propionyl]hydrazine, decanedicarboxylic acid disalicyloyl hydrazide, N-salicylidene-N'-salicylhydrazide, m-nitrobenzhydrazide, 3-aminophthalhydrazide, phthalic dihydrazide, adipic hydrazide, oxalobis(2-hydroxy-5-octylbenzylidene hydrazide), N'-benzoylpyrrolidone carboxylic acid hydrazide, and N,N'-bis(3-(3,5-di-tert-butyl-4-hydroxyphenyl)propionyl)hydrazine.

The amide-based nitrogen compound may be a nitrogen compound having an amide skeleton, and examples thereof include N,N'-bis{2-[3-(3,5-di-tert-butyl-4-hydroxyphenyl)propionyloxyl]ethyl}oxamide.

The triazole-based nitrogen compound may be a nitrogen compound having a triazole skeleton, and examples thereof include N-(2H-1,2,4-triazol-5-yl) salicylamide, 3-amino-1,2,4-triazole and 3-(N-salicyloyl)amino-1,2,4-triazole.

The melamine-based nitrogen compound may be a nitrogen compound having a melamine skeleton, and examples thereof include melamine and melamine derivatives. More specific examples thereof include trisaminotriazine, alkylated trisaminotriazine, alkoxyalkylated trisaminotriazine, melamine, alkylated melamine, alkoxyalkylated melamine, N2-butylmelamine, N2,N2-diethylmelamine, and N,N,N',N',N'',N''-hexakis(methoxymethyl)melamine.

One type of the metal deactivator may be used alone or a mixture of at least two types thereof may be used.
<<Surfactant>>

Examples of the surfactants include nonionic surfactants.

Examples of the nonionic surfactants include polyoxyalkylene adducts.

Examples of alkylene oxides from which the polyoxyalkylene adducts are derived include ethylene oxides, propylene oxides, and butylene oxides.

Examples of the polyoxyalkylene adducts include polyethylene glycol, polypropylene glycol, polyethylene glycol-polypropylene glycol copolymers, ethylene oxide-resorcinol copolymers, polyoxyalkylene acetylene glycols, polyoxyalkylene glyceryl ethers, polyoxyalkylene alkyl ethers, polyoxyalkylene esters, and polyoxyalkylene alkylamides.

Alternatively, examples of the nonionic surfactants include polyoxyalkylene adducts of alcohols. Examples of the alcohols include aliphatic alcohols, aromatic alcohols, and polyhydric alcohols.

One type of the surfactant may be used alone or a mixture of at least two types thereof may be used.
<<Antioxidant>>

Examples of the antioxidants include hindered phenol-based antioxidants such as 2,2'-dihydroxy-3,3'-bis(α-methylcyclohexyl)-5,5'-dimethyldiphenylmethane. The term "antioxidant" described herein denotes a compound having a property of suppressing oxidation of a solder alloy.

One type of the antioxidant may be used alone or a mixture of at least two types thereof may be used.

The flux according to the above-described embodiment is suitably used to carry out continuous reflow to mount an indium alloy sheet and bond solder balls.

In the primary reflow, reflow is carried out under a low temperature condition near a melting point of indium (for example, 170° C.) to bond the heat sink and the chip with the indium alloy sheet, thereby obtaining a semiconductor package. Next, in the secondary reflow, reflow is carried out under a high temperature condition near a melting point of a solder alloy (for example, 250° C.) to bond the solder balls to the rear surface of the semiconductor package.

In the primary reflow, a conventional flux does not wet-spread on the surface of the indium sheet, and is accumulated on the bonding surface, and as a result, a large number of voids are likely to be generated on the bonding surface of the indium alloy sheet. The flux according to the present embodiment contains a solvent (S1) that is likely to be volatilized even at a low temperature. In the primary reflow under a low temperature condition, the solvent (S1) is volatilized. As a result, voids derived from the solvent (S1) are not generated when the indium alloy sheet is melted.

Since the secondary reflow is carried out at a high temperature, an activator or the like is easily gasified, and thus voids are easily formed. In the flux according to the present embodiment, the rosin ester and the dimer acid (A1) are unlikely to be gasified even at a high temperature. Therefore, it is possible to suppress the generation of voids in the primary and secondary reflow under different temperature conditions.

(Method for Producing Bonded Object)

In the method for producing an electronic component including a semiconductor package according to the present aspect, a semiconductor package is obtained by carrying out primary reflow using the flux according to the above-described embodiment and bonding a die and a lid through a thermal interface material (TIM). Next, an electronic component is obtained by carrying out secondary reflow and fixing solder balls to the obtained semiconductor package.

The production method according to the present aspect includes the following step (i) and step (ii).

Step (i):
a step of obtaining a semiconductor package including a bonded object in which a die and a lid are bonded to each other through a TIM Step (ii):
a step of bonding solder balls to the rear surface of the semiconductor package to obtain an electronic component A suitable embodiment of the method for producing an electronic component including a semiconductor package according to the present aspect will be described with reference to FIGS. 1 to 4. In a method for producing the bonded object according to the present embodiment, a substrate 40 on which a lid 10, a TIM 20, and a die 41 are installed is prepared as shown in FIG. 1.

A metalized layer 42 is provided on a surface of the die 41. The metalized layer 42 may be, for example, a Ni plating layer, a Ni/Au plating layer, or the like. The metalized layer 42 may have a plurality of layers having different compositions. The metalized layer 42 can be formed by, for example, a method such as sputtering.

The lid 10 is provided with a metalized layer 11 on a surface facing the TIM 20. Examples of the metalized layer 11 include the same layers as those as the metalized layer 42 of the die 41. The lid 10 includes the heat sink 12 on a surface opposite to the surface facing the TIM 20. Examples of the material of the heat sink include metals such as aluminum, iron, and copper.

The TIM 20 is a sheet made of an alloy of indium and silver. The TIM 20 has a plate shape. The dimensions of the TIM 20 are equal to or smaller than the dimensions of the metalized layer 11 of the lid 10 and the metalized layer 42 of the die 41.

The content of indium in the alloy which is a raw material of the sheet made of an alloy is preferably 75% by mass or greater and 99% by mass or less and more preferably 85% by mass or greater and 95% by mass or less with respect to the total amount (100% by mass) of the alloy.

The content of silver in the alloy is preferably 1% by mass or greater and 25% by mass or less and more preferably 5% by mass or greater and 15% by mass or less with respect to the total amount (100% by mass) of the alloy.

<Step (i)>

In the step (i), a semiconductor package including a bonded object in which a die and a lid are bonded to each other through a thermal interface material (TIM) is obtained.

The step (i) will be described using, as an example, a method including a flux applying step, a lid mounting step, and a heating operation (1).

<<Flux Applying Step>>

Figure 2:
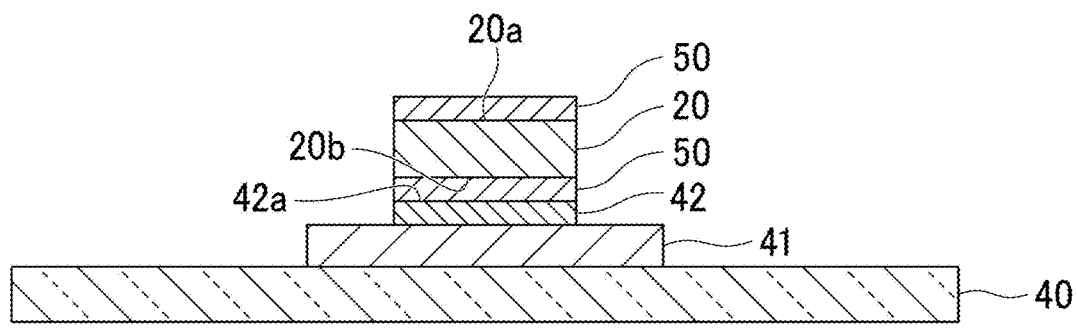
FIG. 2 A cross-sectional view showing a step of coating the TIM and the die with a flux in an embodiment of the method for producing an electronic component.

As a flux 50, the flux 50 according to the above-described embodiment is suitably used. The flux applying step will be described with reference to FIG. 2. FIG. 2 is a cross-sectional view showing the TIM 20 and the die 41 which are coated with the flux 50. In the flux applying step, the flux 50 is interposed on at least one side of between the TIM 20 and the die 41 and between the TIM 20 and the lid 10.

In the flux applying step, a bonding surface (42a, 20b) between the die 41 and the TIM 20 or a bonding surface (11a, 20a) between the lid 10 and the TIM 20 is coated with the flux 50.

The bonding surface is coated with the flux 50 in the following manner. The surface 42a of the metalized layer 42 of the die 41 is coated with the flux 50. Next, the TIM 20 is placed on the metalized layer 42 of the die 41 coated with the flux 50. The surface 20a of the TIM 20 laminated on the die 41, on a side opposite to the surface 20b in contact with the die 41, is coated with the flux 50.

Examples of the application device of the flux 50 include a spray fluxer and a foam fluxer. Among these, a spray fluxer is preferable from the viewpoint of the stability of the application amount.

<<Lid Mounting Step>>

Figure 3:
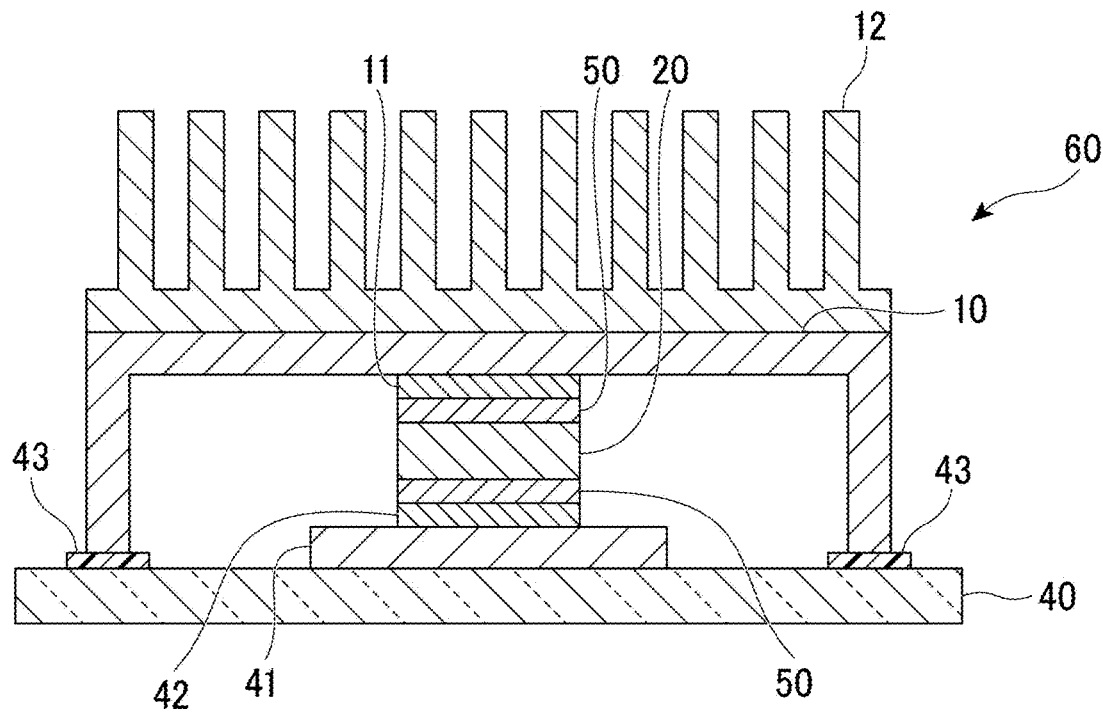
FIG. 3 A cross-sectional view showing a bonded object obtained by fixing the lid to a substrate using the TIM after application of the flux in an embodiment of the method for producing an electronic component.
Figure 4:
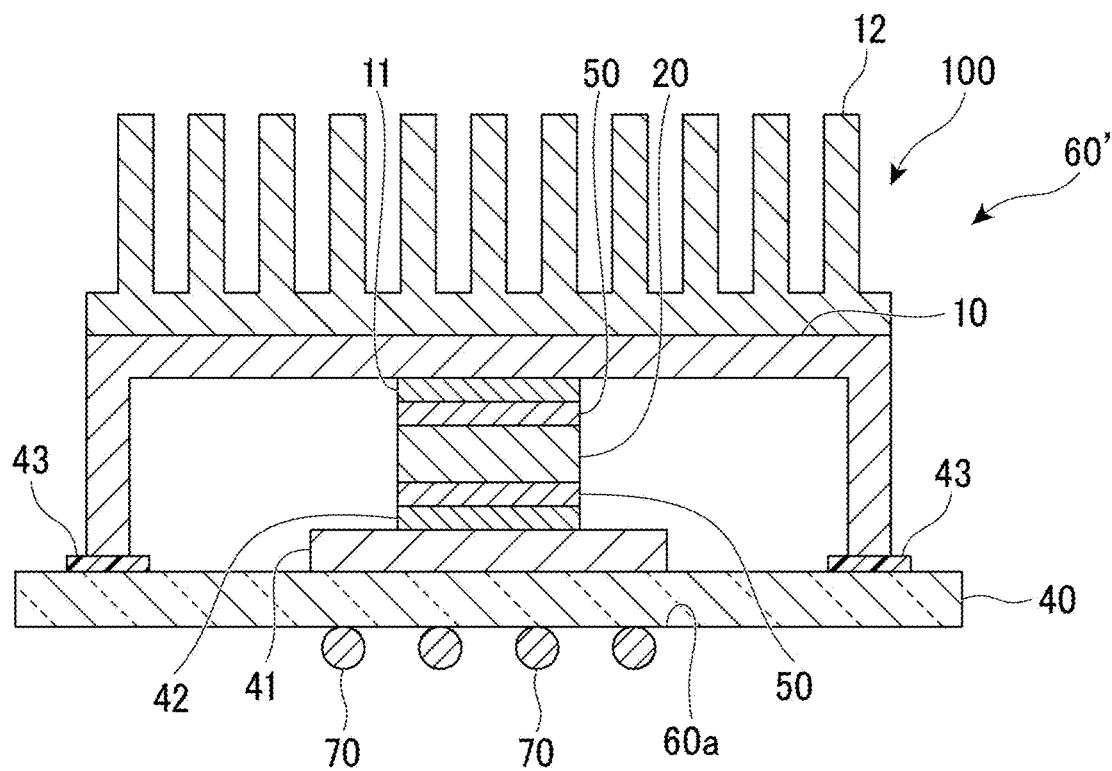
FIG. 4 A cross-sectional view showing an electronic component obtained by bonding solder balls to a rear surface of a semiconductor package in an embodiment of the method for producing an electronic component.

In the lid mounting step, the bonding surface is coated with the flux 50, and the lid 10 is fixed to the substrate 40 on which the TIM 20 and the die 41 are laminated. The lid mounting step will be described with reference to FIG. 3. FIG. 3 is a view showing a laminate 60 in which the lid 10 and the substrate 40 adhered to each other by an adhesive resin 43 after the application of the flux 50.

In the lid mounting step, one surface of the substrate 40 is coated with the adhesive resin 43 after the application of the flux 50. Next, the lid 10 and the substrate 40 on which the TIM 20 and the die 41 are laminated are subjected to thermocompression bonding to cure the adhesive resin 43. In this manner, the lid 10 is fixed to the substrate 40. The laminate 60 in which the lid 10 and the substrate 40 adhered to each other by the adhesive resin 43 is obtained by carrying out the lid mounting step.

<<Heating Operation (1)>>

In the heating operation (1), the laminate 60 is heated by a reflow method. The lid 10 and the die 41 are bonded to each other through the TIM 20 by carrying out the heating operation (1), and a semiconductor package 60' is obtained.

Since the indium constituting the indium alloy sheet which is TIM has a melting point of 156° C., the bonding can be carried out even at a temperature lower than the temperature during the typical reflow. The reflow temperature is preferably in a range of 150° C. to 250° C. and more preferably in a range of 150° C. to 200° C.

<Step (ii)>

In the step (ii), solder balls 70 are bonded to the rear surface 60a of the semiconductor package 60' by carrying out the heating operation (2) to obtain an electronic component 100. The step (ii) will be described with reference to FIG. 4. The rear surface 60a of the semiconductor package 60' denotes a surface of the semiconductor package 60' on a side opposite to the surface on which the lid is fixed.

In the step (ii), first, the solder balls 70 are placed on the rear surface 60a of the semiconductor package 60'. Next, the heating operation (2) is carried out on the semiconductor package 60' on which the solder balls 70 are placed. The solder balls 70 are melted by carrying out the heating operation (2) so that, thereby allowing the solder balls 70 and the semiconductor package 60' to be bonded to each other.

In the heating operation (2), the semiconductor package 60' is heated by a reflow method. The reflow temperature is preferably 200° C. or higher and 280° C. or lower.

According to the method for producing an electronic component including the semiconductor package of the embodiment described above, it is possible to reduce the amount of voids on the bonding surface of the sheet (that is, the surface with the flux interposed) even in the heating operation (2) carried out at a high temperature. As a result, the heat generated from the chip can be dissipated with high efficiency.

OTHER EMBODIMENTS

As described above, in the method for producing a bonded object according to the present aspect, the flux 50 is interposed on at least one side of between the TIM 20 and the die 41 and between the TIM 20 and the lid 10.

In the above-described embodiment, the bonding surface 42a of the die 41 to the TIM 20 and the bonding surface 11a of the TIM 20 to the lid 10 are coated with the flux 50, but the surface coated with the flux 50 is not limited thereto.

For example, the bonding surface 20b of the TIM 20 to the die 41 may be coated with the flux 50, or the bonding surface 11a of the lid 10 to the TIM 20 may be coated with the flux 50 to interpose the flux 50 between the TIM 20 and the die 41.

EXAMPLES

Hereinafter, the present invention will be described based on the examples, but the present invention is not limited to the following examples.

<Preparation of Flux>

Examples 1 to 25 and Comparative Examples 1 to 4

Each flux of examples and comparative examples was prepared with the composition listed in Tables 1 to 4. Raw material components used are shown below. The compositional ratios in Tables 1 to 4 are in units of % by mass when the total mass of the flux is 100% by mass, and the blank denotes 0% by mass.

As the rosin, a rosin ester, an acrylic acid-modified hydrogenated rosin, and a hydrogenated rosin were used.

Rosin Ester:

As the rosin ester, a rosin ester obtained by reacting a hydrogenated rosin with glycerin was used.

As the organic acid, a dimer acid (A1) and other organic acids were used.

Dimer Acid (A1): Hydrogenated Dimer Acid

As the hydrogenated dimer acid, a hydrogenated dimer acid obtained by partially hydrogenating a reaction product of oleic acid and linoleic acid was used. The hydrogenated dimer acid included a dimer acid having 36 carbon atoms and a trimer acid having 54 carbon atoms.

The dimer acid having 36 carbon atoms included plural types of dimer acids having different unsaturation degrees. Here, the unsaturation degree of the dimer acid is a value calculated in accordance with the formula: $\{(2m+2)-n\}/2$, in which m is the number of carbon atoms in a molecule of the dimer acid (A1) and n is the number of hydrogen atoms therein.

The dimer acid having 36 carbon atoms included a dimer acid having an unsaturation degree of 2, a dimer acid having an unsaturation degree of 3, a dimer acid having an unsaturation degree of 4, a dimer acid having an unsaturation degree of 5, a dimer acid having an unsaturation degree of 6, a dimer acid having an unsaturation degree of 7, and a dimer acid having an unsaturation degree of 8.

Other organic acids: adipic acid, palmitic acid, sebacic acid, 12-hydroxystearic acid Amine: 2-phenylimidazole As the solvent (S), a solvent (S1) and a solvent (S2) were used.

Solvent (S1): 3-methoxybutyl acetate (boiling point: 172° C.), hexylene glycol (boiling point: 197° C.)

Solvent (S2): diethylene glycol monohexyl ether (boiling point: 260° C.) Here, the boiling point denotes a temperature of a liquid when a saturated vapor pressure of a target liquid is equal to 1 atm (that is, 1013 hPa).

[Measurement of Weight Reduction Rate]

The weight reduction rates of the rosin ester, the acrylic acid-modified hydrogenated rosin, the hydrogenated rosin, the dimer acid (A1), the other organic acids, the solvent (S1), and the solvent (S2) were measured as follows.

10 mg of a measurement target sample was put into an aluminum pan and heated from room temperature of about 25° C. at a predetermined temperature rising rate until the temperature reached a predetermined temperature, using a differential thermal-thermogravimetric simultaneous measuring device (TG-DTA8122, manufactured by Rigaku Corporation). Then, the weight reduction rate was calculated from a mass $W_0$ (100% by mass) of the target sample before heating and a mass $W_1$ immediately after the temperature reached a predetermined temperature, according to the following calculation formula.

$$\text{Weight reduction rate (\%)} = 100 \times \{W_0 - W_1\}/W_0$$

The weight reduction rates of the rosin ester, the acrylic acid-modified hydrogenated rosin, the hydrogenated rosin, the dimer acid (A1), and other organic acids were measured at a predetermined temperature of 260° C. and a predetermined temperature rising rate of 10° C./min. The numerical values in the parentheses denote the weight reduction rates.

Rosin: rosin ester (7.1% by mass), acrylic acid-modified hydrogenated rosin (11.9% by mass), hydrogenated rosin (25.6% by mass)

Organic acid: hydrogenated dimer acid (0.1% by mass), adipic acid (99.5% by mass), palmitic acid (97.0% by mass), sebacic acid (52.9% by mass), 12-hydroxystearic acid (11.9% by mass)

The weight reduction rates of the solvent (S1) and the solvent (S2) were measured at a predetermined temperature of 150° C. and a predetermined temperature rising rate of 6° C./min.

Solvent (S1): 3-methoxybutyl acetate (99.0% by mass), hexylene glycol (99.0% by mass)

Solvent (S2): diethylene glycol monohexyl ether (21.0% by mass)

[Analysis of Hydrogenated Dimer Acid]

5000 ppm of the hydrogenated dimer acid dissolved in 2-propanol was prepared. This solution was analyzed using a liquid chromatography-Fourier transform mass spectrometer.

As a liquid chromatography device, Ultimate 3000 (manufactured by Thermo Fisher Scientific, Inc.) was used. Gradient analysis was carried out using a mixed solution of a 5 mM ammonium formate aqueous solution and methanol as a mobile phase. Aquity UPLC BEH C18 (1.7 μm, 2.1×100 mm) was used as a column. The column temperature was set to 50° C., the flow rate was set to 0.35 mL/min, and the injection amount was set to 1 μL.

Orbitrap ID-X (manufactured by Thermo Fisher Scientific, Inc.) was used as a Fourier transform mass spectrometer. The analysis conditions were set to a negative mode of an electrospray ion method. The measurement range of m/z was set to 200 to 2000.

It was confirmed that the used hydrogenated dimer acid had a plurality of molecules. Based on the created ion chromatogram, the proportion of the peak area derived from each molecule with respect to the total peak area (100%) derived from all of the detected molecules was calculated.

The hydrogenated dimer acid included plural types of dimer acids having 36 carbon atoms and a trimer acid having 54 carbon atoms. The total peak area derived from the plural types of dimer acids having 36 carbon atoms was 99% or greater with respect to the total area (100%) derived from all of the molecules.

The proportion of the area of each dimer acid having 36 carbon atoms with respect to the total area (100%) derived from all of the molecules was as follows.

The proportion of the dimer acid having an unsaturation degree of 2 was 26.7%, that of the dimer acid having an unsaturation degree of 3 was 40.6%, that of the dimer acid having an unsaturation degree of 4 was 10.6%, that of the dimer acid having an unsaturation degree of 5 was 2.6%, that of the dimer acid having an unsaturation degree of 6 was 7.5%, that of the dimer acid having an unsaturation degree of 7 was 10.1%, and that of the dimer acid having an unsaturation degree of 8 was 1.9%.

The content of each dimer acid having a different unsaturation degree with respect to the total amount (100% by mass) of the hydrogenated dimer acid is presumed to substantially match the above-described proportion of the area.

[Measurement of Softening Point]

The softening point of the rosin was measured by a ring and ball method described in JIS K 5902. The rosin having a softening point of 80° C. or lower was measured in a water bath. In addition, the rosin having a softening point exceeding 80° C. was measured in a glycerin bath. The measurement was carried out twice for each rosin. The following softening points are average values of values measured twice.

Rosin ester (softening point: 95° C.), acrylic acid-modified hydrogenated rosin (softening point: 130° C.), and hydrogenated rosin (softening point: 72° C.).

[Measurement of Acid Value]

The acid value of the rosin ester was measured in conformity with 3.1 Neutralization Titration Method of JIS K 0070 "Test Method for Acid Value, Saponification Value, Ester Value, Iodine Value, Hydroxyl Value, and Unsaponifiable Substance of Chemical Products".

Three g of the rosin ester was dissolved in ethanol/diethyl ether (at a mixing ratio of 1:1). Phenolphthalein was used as an indicator, and the titration was carried out with a 0.1 mol/L KOH ethanol solution. The end point was set as a point at which the solution turned light red.

The acid value of the rosin ester was 6 mgKOH/g.

<<Evaluation of suppressibility of generation of voids>> and <<Evaluation of wettability>> were carried out by the evaluation method described in <Evaluation 1> below. The evaluation results are shown in Tables 1 to 4.

<Evaluation 1>

<<Evaluation of suppressibility of generation of voids>>

Method for Producing Bonded Object:

A lid having a surface provided with an Au/Ni plating portion (size: 8 mm×8 mm) and a substrate having a surface provided with an Au/Ni plating portion (size: 8 mm×8 mm) were prepared.

An indium alloy sheet (size: 7 mm×7 mm×400 µm) formed of an alloy composed of 90% by mass of In and 10% by mass of Ag was prepared as a solder sheet. The surface and the rear surface of the indium alloy sheet was spray-coated with 2 mg of the flux of each example.

A copper plate having a thickness of 300 µm was placed as a spacer on the periphery of the Au/Ni plating portion of the substrate. Next, the indium alloy sheet coated with the flux was fixed with a clip in a state of being interposed between the lid and the Au/Ni plating portion of the substrate.

Next, the lid and the substrate with the indium alloy sheet interposed therebetween were subjected to primary reflow to obtain a bonded object. The primary reflow was carried out by raising the temperature at a temperature rising rate of 10° C./min in the atmosphere until the temperature reached 170° C.

Next, the bonded object that had been subjected to the primary reflow was subjected to secondary reflow.

The secondary reflow was carried out by raising the temperature from room temperature to 250° C. at a temperature rising rate of 0.5° C./sec for 450 seconds.

Verification Method:

The void area was measured by irradiating the bonded object, which had been subjected to the secondary reflow, with X-rays from the vertical direction of the substrate and analyzing the transmitted X-rays. XD7600NT (manufactured by Nordson Corporation) was used to carry out the measurement. In the measurement of the void area, a case in which X-rays passed through at least one void was assumed that voids were present. Voids having a diameter of 0.1 µm or greater were detected. Next, the proportion of the total area of the voids with respect to the total area of the indium alloy sheet was calculated as a void area ratio (%).

Determination Standards:

A: The void area ratio was less than 10%.
B: The void area ratio was 10% or greater less than 15%.
C: The void area ratio was 15% or greater.

The flux with an evaluation result of A or B was regarded as acceptable, and the flux with an evaluation result of C was regarded as unacceptable.

Evaluation of Wettability>>

Verification Method:

An indium alloy sheet (size: 2 mm×2 mm×100 µm) formed of an alloy composed of 90% by mass of In and 10% by mass of Ag was prepared as a solder sheet.

The surface and the rear surface of the indium alloy sheet was spray-coated with 0.5 mg of the flux of each example. The indium alloy sheet coated with the flux was placed on an Au/Ni electrode.

Next, the electrode on which the indium alloy sheet was placed was subjected to reflow under the following conditions. The reflow was carried out by raising the temperature to 180° C. at a temperature rising rate of 6° C./min and holding the temperature at 180° C. for three minutes.

Next, the area of the wet spread was measured after removal of the flux.

Determination Standards:

A: The area of the wet spread was 2.5 mm² or greater.
B: The area of the wet spread was 2.0 mm² or greater and less than 2.5 mm²

The flux with an evaluation result of A or B was regarded as acceptable.

<<Evaluation of Coating Properties>>

Verification Method:

It was verified whether or not a metal plate could be coated with the flux of each example using a spray device (TG-SS2 (full cone type), manufactured by Spraying Systems Co.) at an air pressure of 0.3 MPa.

Determination Standards:

A: The metal plate could be coated with the flux using the spray device.
B: The metal plate could not be coated with the flux using the spray device.

The flux with an evaluation result of A was regarded as acceptable, and the flux with an evaluation result of B was regarded as unacceptable.

<<Evaluation of suppressibility of generation of voids>> and <<Evaluation of wettability>> were carried out by the evaluation method described in <Evaluation 2> below. The evaluation results thereof are shown in Table 4.

<Evaluation 2>

<<Evaluation of Suppressibility of Generation of Voids>>

A SAC alloy sheet (size: 7 mm×7 mm×400 µm) formed of an alloy composed of 3% by mass of Ag, 0.5% by mass of Cu, and a balance of Sn was prepared as a solder sheet.

The verification was carried out using the SAC alloy sheet and the fluxes of Example 1 and Comparative Example 4 by the same method as in <<Evaluation of suppressibility of generation of void>> of <Evaluation 1>.

The conditions of the primary reflow and the secondary reflow were as follows. The primary reflow was carried out by raising the temperature at a temperature rising rate of 10° C./min in the atmosphere until the temperature reached 250° C. from room temperature (25° C.). The secondary reflow was carried out by raising the temperature at a temperature rising rate of 0.5° C./min for 450 seconds until the temperature reached 250° C. from room temperature (25° C.).

<<Evaluation of Wettability>>

A SAC alloy sheet (size: 2 mm×2 mm×100 µm) formed of an alloy composed of 3% by mass of Ag, 0.5% by mass of Cu, and a balance of Sn was prepared as a solder sheet.

The verification was carried out using the SAC alloy sheet and the fluxes of Example 1 and Comparative Example 4 by the same method as in <<Evaluation of wettability of <Evaluation 1>.

The reflow was carried out by raising the temperature to 250° C. from room temperature (25° C.) at a temperature rising rate of 6° C./min and holding the temperature at 250° C. for 3 minutes.

TABLE 1

|  |  |  | Example 1 | Example 2 | Example 3 | Comparative Example 1 | Comparative Example 2 | Comparative Example 3 | Comparative Example 4 |
|---|---|---|---|---|---|---|---|---|---|
| Rosin |  | Rosin ester | 25 | 25 | 25 | 25 | 25 | 25 |  |
|  |  | Acrylic acid-modified hydrogenated rosin |  |  |  |  |  |  | 15 |
|  |  | Hydrogenated rosin |  |  |  |  |  |  | 10 |
| Organic acid (A) | Dimer acid (A1) | Hydrogenated dimer acid | 15 | 15 | 15 | 15 |  |  | 15 |
|  | Other organic acids | Adipic acid |  |  |  |  | 15 |  |  |
|  |  | Palmitic acid |  |  |  |  |  |  |  |
|  |  | Sebacic acid |  |  |  |  |  | 15 |  |
|  |  | 12-Hydroxystearic acid |  |  |  |  |  |  |  |
| Amine |  | 2-Phenylimidazole |  |  |  |  |  |  |  |
| Solvent (S) | Solvent (S1) | 3-Methoxybutyl acetate | 60 |  | 50 |  | 60 | 60 | 60 |
|  |  | Hexylene glycol |  | 60 |  |  |  |  |  |
|  | Solvent (S2) | Diethylene glycol monohexyl ether |  |  | 10 | 60 |  |  |  |
|  | Total/% by mass |  | 100 | 100 | 100 | 100 | 100 | 100 | 100 |
| Content of dimer acid (A1) with respect to total mass of organic acid (A)/% by mass |  |  | 100 | 100 | 100 | 100 | 0 | 0 | 100 |
| Content of solvent (S1) with respect to total mass of solvent (S)/% by mass |  |  | 100 | 100 | 83.33 | 0 | 100 | 100 | 100 |
| Evaluation 1 (indium alloy sheet) | Evaluation of suppressibility of generation of voids |  | A | A | B | C | C | C | C |
|  | Evaluation of wettability |  | A | A | A | A | A | A | A |
|  | Evaluation of coating properties |  | A | A | A | A | B | B | A |

The suppressibility of generation of voids of the fluxes of Examples 1 and 2 containing the rosin ester, the dimer acid (A1), and the solvent (S1) was evaluated as A.

The suppressibility of generation of voids of the flux of Comparative Example 1, which did not contain the solvent (S1), was evaluated as C.

The suppressibility of generation of voids of the fluxes of Comparative Examples 2 and 3, which did not contain the dimer acid (A1), was evaluated as C.

The suppressibility of generation of voids of the flux of Comparative Example 4, which did not contain the rosin ester, was evaluated as C.

The suppressibility of generation of voids of the flux of Example 1 in which the content of the solvent (S1) was 100% by mass with respect to the total mass of the solvent (S) was evaluated as A.

The suppressibility of generation of voids of the flux of Example 3 in which the content of the solvent (S1) was 83% by mass with respect to the total mass of the solvent (S) was evaluated as B.

The coating properties of the flux of Example 1, which contained the dimer acid (A1), were evaluated as A.

The coating properties of the flux of Comparative Example 1, which did not contain the dimer acid (A1), were evaluated as B.

The coating properties of the fluxes of Comparative Examples 2 and 3, in which the content of other organic acids was 15% by mass with respect to the total mass of the flux, were evaluated as B.

TABLE 2

|  |  |  | Example 4 | Example 5 | Example 6 | Example 7 | Example 8 | Example 9 | Example 10 | Example 11 | Example 12 | Example 13 |
|---|---|---|---|---|---|---|---|---|---|---|---|---|
| Rosin |  | Rosin ester | 25 | 25 | 25 | 25 | 25 | 25 | 25 | 25 | 25 | 25 |
|  |  | Acrylic acid-modified hydrogenated rosin |  |  |  |  |  |  |  |  |  |  |
|  |  | Hydrogenated rosin |  |  |  |  |  |  |  |  |  |  |
| Organic acid (A) | Dimer acid (A1) | Hydrogenated dimer acid | 15 | 15 | 15 | 15 | 15 | 15 | 15 | 15 | 15 | 15 |
|  | Other organic acids | Adipic acid | 1 | 2 | 5 |  |  |  |  | 1 | 2 | 3 |
|  |  | Palmitic acid |  |  |  | 1 |  |  |  |  |  |  |
|  |  | Sebacic acid |  |  |  |  | 1 |  |  |  |  |  |
|  |  | 12-Hydroxystearic acid |  |  |  |  |  | 1 |  |  |  |  |
| Amine |  | 2-Phenylimidazole |  |  |  |  |  |  | 1 | 1 | 2 | 5 |
| Solvent (S) | Solvent (S1) | 3-Methoxybutyl acetate | 59 | 58 | 55 | 59 | 59 | 59 | 59 | 58 | 56 | 52 |
|  |  | Hexylene glycol |  |  |  |  |  |  |  |  |  |  |
|  | Solvent (S2) | Diethylene glycol monohexyl ether |  |  |  |  |  |  |  |  |  |  |
|  | Total/% by mass |  | 100 | 100 | 100 | 100 | 100 | 100 | 100 | 100 | 100 | 100 |
| Content of dimer acid (A1) with respect to total mass of organic acid (A)/% by mass |  |  | 93.75 | 88.24 | 75.00 | 93.75 | 93.75 | 93.75 | 100 | 93.75 | 88.24 | 83.33 |

TABLE 2-continued

|  |  | Example 4 | Example 5 | Example 6 | Example 7 | Example 8 | Example 9 | Example 10 | Example 11 | Example 12 | Example 13 |
|---|---|---|---|---|---|---|---|---|---|---|---|
| Content of solvent (S1) with respect to total mass of solvent (S)/% by mass | | 100 | 100 | 100 | 100 | 100 | 100 | 100 | 100 | 100 | 100 |
| Evaluation 1 (indium alloy sheet) | Evaluation of suppressibility of generation of voids | A | B | B | A | A | A | A | A | B | B |
| | Evaluation of wettability | A | A | A | A | A | A | A | A | A | A |
| | Evaluation of coating properties | A | A | A | A | A | A | A | A | A | A |

The suppressibility of generation of voids of the fluxes of Examples 4 and 7 to 11, in which the content of the dimer acid (A1) was 90% by mass or greater with respect to the total mass of the organic acid (A), was evaluated as A.

The suppressibility of generation of voids of the fluxes of Examples 5, 6, 12, and 13, in which the content of the dimer acid (A1) was less than 90% by mass with respect to the total mass of the organic acid (A), was evaluated as B.

TABLE 3

| | | | Example 14 | Example 15 | Example 16 | Example 17 | Example 18 | Example 19 | Example 20 |
|---|---|---|---|---|---|---|---|---|---|
| Rosin | | Rosin ester | 15 | 15 | 15 | 15 | 15 | 25 | 25 |
| | | Acrylic acid-modified hydrogenated rosin | | | | | | | |
| Organic acid (A) | Dimer acid (A1) | Hydrogenated rosin acid | 10 | 15 | 30 | 50 | 60 | 30 | 50 |
| | | Hydrogenated dimer | | | | | | | |
| | Other organic acids | Adipic acid | | | | | | | |
| | | Palmitic acid | | | | | | | |
| | | Sebacic acid | | | | | | | |
| | | 12-Hydroxystearic acid | | | | | | | |
| Amine | | 2-Phenylimidazole | | | | | | | |
| Solvent (S) | Solvent (S1) | 3-Methoxybutyl acetate | 75 | 70 | 55 | 35 | 25 | 45 | 25 |
| | | Hexylene glycol | | | | | | | |
| | Solvent (S2) | Diethylene glycol monohexyl ether | | | | | | | |
| | | Total/% by mass | 100 | 100 | 100 | 100 | 100 | 100 | 100 |
| Content of dimer acid (A1) with respect to total mass of organic acid (A)/% by mass | | | 100 | 100 | 100 | 100 | 100 | 100 | 100 |
| Content of solvent (S1) with respect to total mass of solvent (S)/% by mass | | | 100 | 100 | 100 | 100 | 100 | 100 | 100 |
| Evaluation 1 (indium alloy sheet) | Evaluation of suppressibility of generation of voids | | A | A | A | A | A | A | A |
| | Evaluation of wettability | | B | A | A | A | A | A | A |
| | Evaluation of coating properties | | A | A | A | A | A | A | A |

| | | | Example 21 | Example 22 | Example 23 | Example 24 | Example 25 |
|---|---|---|---|---|---|---|---|
| Rosin | | Rosin ester | 50 | 50 | 50 | 60 | 60 |
| | | Acrylic acid-modified hydrogenated rosin | | | | | |
| Organic acid (A) | Dimer acid (A1) | Hydrogenated rosin acid | 10 | 15 | 30 | 10 | 15 |
| | | Hydrogenated dimer | | | | | |
| | Other organic acids | Adipic acid | | | | | |
| | | Palmitic acid | | | | | |
| | | Sebacic acid | | | | | |
| | | 12-Hydroxystearic acid | | | | | |
| Amine | | 2-Phenylimidazole | | | | | |
| Solvent (S) | Solvent (S1) | 3-Methoxybutyl acetate | 40 | 35 | 20 | 30 | 25 |
| | | Hexylene glycol | | | | | |
| | Solvent (S2) | Diethylene glycol monohexyl ether | | | | | |
| | | Total/% by mass | 100 | 100 | 100 | 100 | 100 |

TABLE 3-continued

|  |  |  |  |  |  |  |
|---|---|---|---|---|---|---|
| Content of dimer acid (A1) with respect to total mass of organic acid (A)/% by mass | | 100 | 100 | 100 | 100 | 100 |
| Content of solvent (S1) with respect to total mass of solvent (S)/% by mass | | 100 | 100 | 100 | 100 | 100 |
| Evaluation 1 (indium alloy sheet) | Evaluation of suppressibility of generation of voids | A | A | A | A | A |
|  | Evaluation of wettability | B | A | A | B | A |
|  | Evaluation of coating properties | A | A | A | A | A |

The wettability of the fluxes of Examples 15 to 20, 22, 23, and 25, in which the content of the dimer acid (A1) was 15% by mass or greater with respect to the total mass of the flux, was evaluated as A.

The wettability of the fluxes of Examples 14, 21, and 24, in which the content of the dimer acid (A1) was 10% by mass with respect to the total mass of the flux, was evaluated as B.

TABLE 4

|  |  |  | Example 1 | Comparative Example 4 |
|---|---|---|---|---|
| | Rosin | Rosin ester | 25 | |
| | | Acrylic acid-modified hydrogenated rosin | | 15 |
| | | Hydrogenated rosin | | 10 |
| Organic acid (A) | Dimer acid (A1) | Hydrogenated dimer acid | 15 | 15 |
| | Other organic acids | Adipic acid | | |
| | | Palmitic acid | | |
| | | Sebacic acid | | |
| | | 12-Hydroxystearic acid | | |
| | Amine | 2-Phenylimidazole | | |
| Solvent (S) | Solvent (S1) | 3-Methoxybutyl acetate | 60 | 60 |
| | | Hexylene glycol | | |
| | Solvent (S2) | Diethylene glycol monohexyl ether | | |
| | | Total/% by mass | 100 | 100 |
| Content of dimer acid (A1) with respect to total mass of organic acid (A)/% by mass | | | 100 | 100 |
| Content of solvent (S1) with respect to total mass of solvent (S)/% by mass | | | 100 | 100 |
| Evaluation 1 (indium alloy sheet) | Evaluation of suppressibility of generation of voids | | A | C |
| | Evaluation of wettability | | A | A |
| | Evaluation of coating properties | | A | A |
| Evaluation 2 (SAC alloy sheet) | Evaluation of suppressibility of generation of voids | | A | A |
| | Evaluation of wettability | | A | A |

When the SAC alloy sheet and the flux of Example 1 were used, the suppressibility of generation of voids and the wettability were evaluated as A in <Evaluation 2>. In addition, when the SAC alloy sheet and the flux of Comparative Example 4 were used, the suppressibility of generation of voids and the wettability were evaluated as A.

In the flux of Comparative Example 4, which did not contain the rosin ester, the suppressibility of generation of voids was evaluated as A when the SAC alloy sheet was used, whilst the suppressibility of generation of voids was evaluated as C when the indium alloy sheet was used. That is, voids were likely to be generated when the indium alloy sheet was used as compared with a case where the SAC alloy sheet was used.

The flux of Example 1, which contained the rosin ester, could sufficiently suppress generation of voids even when the indium alloy sheet was used.

Since the flux of the present invention contains the rosin ester, the dimer acid (A1), and the solvent (S1), it is possible to suppress the generation of voids in the resultant bonded object even when a solder sheet in which the content of indium is high is used.

INDUSTRIAL APPLICABILITY

The flux of the present invention is suitably used in a process of producing an electronic component with enhanced heat dissipation efficiency, in which an indium alloy sheet is used.

REFERENCE SIGNS LIST

10 Lid, 11 Metalized layer, 11a Bonding surface, 12 Heat sink, 20 Thermal interface material (TIM), 20a, 20b Bonding surface, 40 Substrate, 41 Die, 42 Metalized layer, 42a Bonding surface, 43 Adhesive resin, 50 Flux, 60 Semiconductor package, 60a Rear surface, 70 Solder ball, 100 Electronic component

The invention claimed is:

1. A flux comprising:
   a rosin ester;
   an organic acid (A); and
   a solvent(S),
   wherein the organic acid (A) comprises a dimer acid (A1) having a weight reduction rate of 1% by mass or less when heated to 260° C. at a temperature rising rate of 10° C./min in thermogravimetric measurement, and
   the solvent(S) comprises a solvent (S1) having a weight reduction rate of 99% by mass or greater when heated to 150° C. at a temperature rising rate of 6° C./min in the thermogravimetric measurement,
   a content of the dimer acid (A1) is 5% by mass or greater and 70% by mass or less with respect to a total mass, 100% by mass, of the flux,
   a content of the dimer acid (A1) is 75% by mass or greater with respect to a total mass of the organic acid (A),
   a content of the solvent (S1) is 10% by mass or greater and 90% by mass or less with respect to the total mass, 100% by mass, of the flux, and
   a content of the solvent (S1) is 70% by mass or greater with respect to a total mass of the solvent(S).

2. The flux according to claim 1, wherein the content of the solvent (S1) is 80% by mass or greater with respect to the total mass of the solvent(S).

3. The flux according to claim 1, wherein the dimer acid (A1) is at least one selected from the group consisting of dimers to which unsaturated fatty acids having 18 carbon atoms are bonded.

4. The flux according to claim 1, wherein the solvent (S1) has a boiling point of 200° C. or lower.

5. The flux according to claim 1, further comprising an azole.

6. The flux according to claim 1, wherein the content of the solvent (S1) is 10% by mass or greater and 75% by mass or less with respect to the total mass, 100% by mass, of the flux, and
   the content of the dimer acid (A1) is 10% by mass or greater and 60% by mass or less with respect to the total mass of the flux.

7. The flux according to claim 1, wherein the content of the solvent (S1) is 10% by mass or greater and 75% by mass or less with respect to the total mass, 100% by mass, of the flux, and
   a content of the rosin ester is 15% by mass or greater and 60% by mass or less with respect to a total mass of the flux.

8. A method for producing an electronic component comprising a semiconductor package, the method comprising:
   a step (i) of obtaining a semiconductor package including a bonded object in which a die and a lid are bonded to each other through a thermal interface material (TIM); and
   a step (ii) of bonding a solder ball to a rear surface of the semiconductor package to obtain an electronic component,
   wherein the TIM is a sheet made of an alloy consisting of indium and silver,
   the step (i) comprises a heating operation (1) of bonding the die and the lid to each other by a reflow method with a flux of claim 1 being interposed on at least one side of between the TIM and the die and between the TIM and the lid, and
   the step (ii) comprises a heating operation (2) of bonding the solder ball and the semiconductor package to each other by the reflow method.

9. The method for producing an electronic component according to claim 8, wherein the heating operation (1) is carried out under a temperature condition of 150° C. to 250° C., and
   the heating operation (2) is carried out under a temperature condition of 200° C. to 280° C.

* * * * *